US011257820B2

(12) United States Patent
Smith

(10) Patent No.: US 11,257,820 B2
(45) Date of Patent: Feb. 22, 2022

(54) HIGH-VOLTAGE SWITCH WITH INTEGRATED WELL REGION

(71) Applicant: INTEL CORPORATION, Santa Clara, CA (US)

(72) Inventor: Michael A. Smith, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 16/797,923

(22) Filed: Feb. 21, 2020

(65) Prior Publication Data

US 2021/0265352 A1     Aug. 26, 2021

(51) Int. Cl.
| | |
|---|---|
| *H01L 21/00* | (2006.01) |
| *H01L 27/092* | (2006.01) |
| *H01L 27/105* | (2006.01) |
| *G11C 16/04* | (2006.01) |

(52) U.S. Cl.
CPC ...... *H01L 27/0925* (2013.01); *H01L 27/0928* (2013.01); *H01L 27/1052* (2013.01); *G11C 16/0483* (2013.01)

(58) Field of Classification Search
CPC ............. H01L 27/0925; H01L 27/0928; H01L 27/1052
See application file for complete search history.

(56) References Cited

U.S. PATENT DOCUMENTS

| | | | |
|---|---|---|---|
| 8,766,365 B2 | 7/2014 | Smith | |
| 9,847,335 B2 | 12/2017 | Smith | |
| 10,163,893 B1 * | 12/2018 | Smith | ................. G11C 16/0483 |
| 2019/0206856 A1 * | 7/2019 | Smith | ............... H01L 21/28158 |

* cited by examiner

*Primary Examiner* — Richard A Booth
(74) *Attorney, Agent, or Firm* — Compass IP Law PC

(57) ABSTRACT

A semiconductor device includes a semiconductor layer having a first doped region, a second doped region, and a third doped region. Each of the regions has the same dopant type. The first doped region extends further into a thickness of the semiconductor layer than the second or third doped regions, and the third doped region provides a conductive pathway between the first doped region and the second doped region. The semiconductor device also includes a first transistor and a second transistor. The first doped region is beneath the first transistor and the second doped region is beneath the second transistor. By using a commonly doped well region that includes each of the first, second, and third doped regions, at least the first and second transistors can be integrated closer together which lowers the overall device footprint. The transistors may be FETs, or other transistor technology.

20 Claims, 17 Drawing Sheets

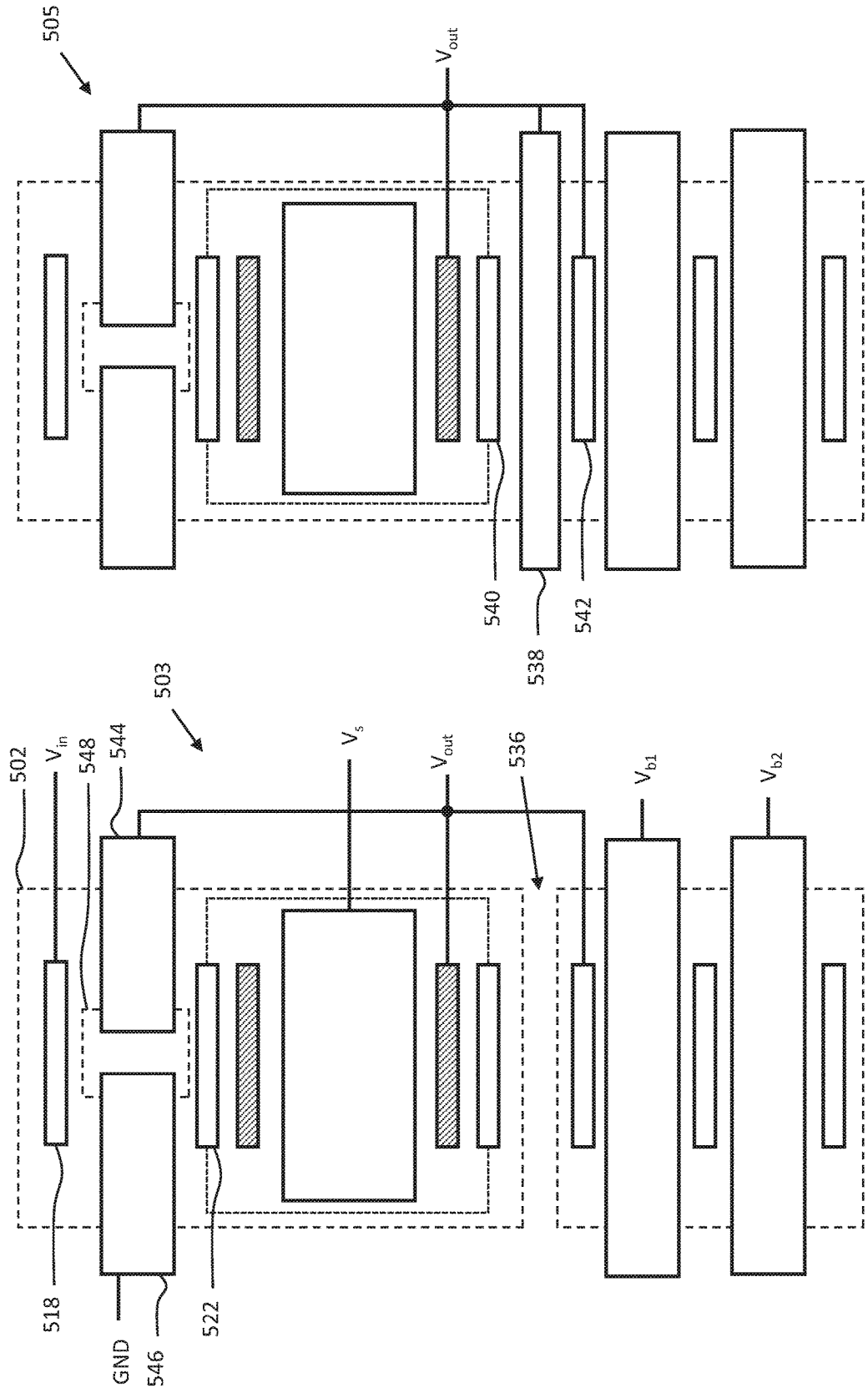

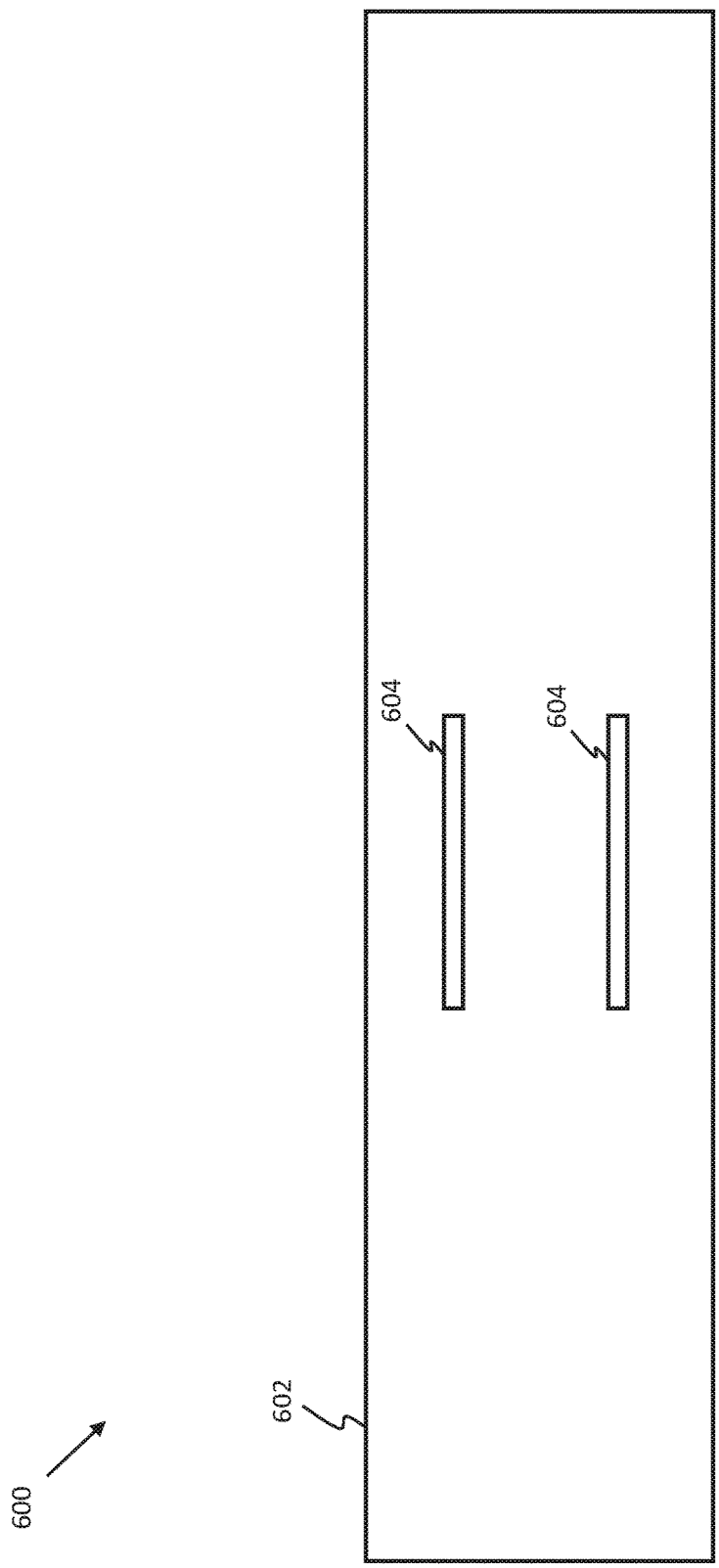

HIGH-VOLTAGE SWITCH WITH INTEGRATED WELL REGION

BACKGROUND

There are many different types of integrated circuit memory including random-access memory (RAM), read only memory (ROM), dynamic random-access memory (DRAM), synchronous dynamic random access memory (SDRAM), and flash memory. Flash memory devices typically use a one-transistor memory cell that allows for high memory densities, high reliability, and low power consumption. Memory cells are typically arranged in a memory array and are addressable with a row/column format. Data lines used to transfer signals to/from the various memory cells are sometimes coupled to circuitry that may be configured to handle relatively low voltages (e.g., that may be referred to as low-voltage circuitry), such as logic or data cache circuitry. The low-voltage circuitry provides relatively low voltages (e.g., less than 5 volts, such as about 1 to 3 volts) to the data lines during read or write operations with one or more selected memory cells. However, and by way of example, during erase operations in the context of some memory arrays (such as NAND flash memory arrays), memory cells may be erased a block at a time by grounding all of the access lines in the block while allowing the data lines to float. A relatively high erase voltage (e.g., greater than 5 volts, such as about 12 to 30 volts) is then applied to the channels of the memory cells to remove charge from the storage structure of each cell in that block. As will be appreciated, a number of non-trivial issues remain with respect to integrating the high-voltage devices needed to handle such high erase voltages with other lower-voltage circuitry on the same substrate.

BRIEF DESCRIPTION OF THE DRAWINGS

Features and advantages of embodiments of the claimed subject matter will become apparent as the following Detailed Description proceeds, and upon reference to the Drawings, in which:

FIGS. 5A-5H illustrate top-down cross-section views of an integrated circuit that includes a switching device, in accordance with some embodiments of the present disclosure.

FIGS. 6A-6H illustrate top town cross-section views of integrated circuit structures resulting from a fabrication process for a switching device, in accordance with an embodiment of the present disclosure.

Figure 1:
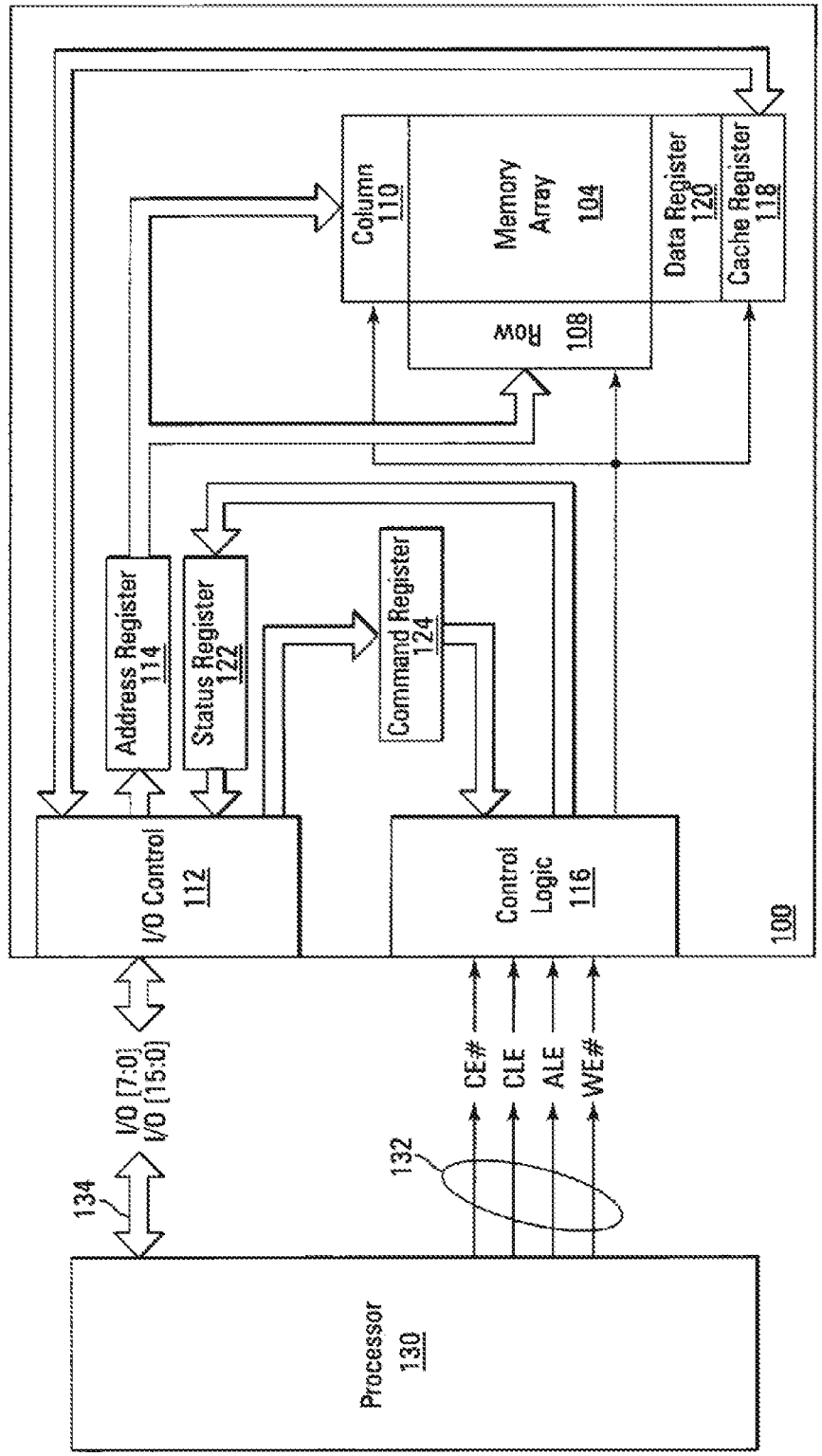
FIG. 1 illustrates a block diagram of a memory system, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

A high-voltage switching device is disclosed. The device is particularly well-suited for integration with memory devices to provide high erase or programming voltages to one or more cells in a memory array, although other high-voltage applications may benefit as well. An example semiconductor device according to one such embodiment includes a semiconductor layer having a first doped region, a second doped region, and a third doped region. Each of the regions has the same dopant type. The first doped region extends further into a thickness of the semiconductor layer than the second and third doped regions, and the third doped region provides a conductive pathway between the first doped region and the second doped region. The device also includes a first transistor and a second transistor, each on the semiconductor layer. The first and second transistors may be FETs in some embodiments, but other transistor technologies may also be used as will be appreciated. In one such embodiment, the first transistor has a first gate structure, a first channel region, a first source region, and a first drain region, the channel region being between the source and drain regions. The first source region and the first drain region are doped at a higher concentration and with an opposite dopant type, relative to each of the first, second, and third doped regions. The second transistor has a second gate structure, a second channel region, a second source region, and a second drain region, the channel region being between the source and drain regions. The second source region and the second drain region are doped at a higher concentration and with a same dopant type, relative to each of the first, second, and third doped regions. The first doped region is beneath the first transistor and the second doped region is beneath the second transistor. Numerous variations, other embodiments, and applications will be appreciated in light of this disclosure.

General Overview

As previously noted, there are a number of non-trivial issues that remain with respect to integrating high-voltage devices needed to handle such high erase voltages with other lower-voltage circuitry on the same substrate. For example, high-voltage FET devices require a relatively large footprint on the chip. In addition, high-voltage FET devices typically require a certain distance between them and lower voltage devices, which tends to constrain possible layout options or is otherwise wasteful.

Thus, techniques are provided herein to reduce the size of high-voltage switching devices, which may include either or both reducing the footprint of transistors making up the switch device and removing one or more of the transistor from the switch device. The techniques are particularly well-suited to memory applications, such as high-voltage switches for NAND flash memory, although other circuits or memory configurations that utilize high-voltage switches can equally benefit.

In an example embodiment, the switching device includes a plurality of transistor devices, such as field effect transistors (FETs). The transistors are arranged to safely and quickly transmit high-voltages (e.g., voltages over 12 volts, 24 volts, or higher) when the switching device is activated, such as upon receiving an erase or programming command in the context of an integrated circuit memory. Integrating opposite-polarity transistors onto doped regions of an active area of semiconductor material, each doped region having the same dopant type can be achieved using various doping schemes, including implant-type doping and epitaxial deposition of doped materials, as will be discussed in turn. In any such cases, such a configuration creates area savings by reducing the contact spacing to the active areas and the distances between the active areas beneath the FETs (or other transistors). This is advantageous since a memory device may include many such high-voltage switches to effectively erase each of the memory cells in the memory array.

According to some specific example embodiments, a high-voltage switching device includes a semiconductor layer having a first doped region, a second doped region, and a third doped region. Each of the regions has the same dopant type. So, for instance, each of the regions is n-type doped when the switch is a p-channel switch, and each of the regions is p-type doped when the switch is an n-channel switch. The first doped region extends further into a thickness of the semiconductor layer than the second and third doped regions, and the third doped region provides a conductive pathway between the first doped region and the second doped region. A first FET device and a second FET device are on the semiconductor layer. The first FET device has a first gate structure over a first channel region, and further includes a first source region and a first drain region with the first channel region therebetween. The first source region and first drain region are doped at a higher concentration and with an opposite dopant type, relative to each of the underlying first, second, and third doped regions. The second FET device has a second gate structure over a second channel region, and further includes a second source region and a second drain region with the second channel region therebetween. The second source region and the second drain region are doped at a higher concentration and with a same dopant type, relative to each of the underlying first, second, and third doped regions. The doping profile of the second FET (e.g., having source and drain regions with the same dopant type as the active semiconductor region between them) allows the second FET to operate in a depletion mode. The first doped region of the semiconductor layer is beneath the first FET device, and the second doped region of the semiconductor layer is beneath the second FET device. Additional FET devices may be included as part of a discharge path and isolated from the first, second, and third doped regions of the semiconductor layer. The additional FET devices may be isolated using one or more shallow trench isolation structures or another FET device used as an isolation structure.

Note that the source and drain regions can be, for example, implantation doped regions of the semiconductor layer, or epitaxial depositions provided into corresponding recesses etched into the semiconductor layer. The channel regions can be, for example, undoped (or lightly doped, as the case may be), and may be native to (portions of) the semiconductor layer or an epitaxial material that is deposited on the semiconductor layer during a channel material replacement process. Further note that the channel region may be planar or non-planar (e.g., fin). The doped regions of the semiconductor layer can be, for example, implantation doped using a mask, as explained herein. Other embodiments may be doped, for instance, in situ during formation of the layer.

According to another example embodiment, a high-voltage switching device includes a semiconductor layer having a first doped region, a second doped region, and a third doped region, as well as the first and second FET devices on the semiconductor layer, as discussed above. The high-voltage switching device further includes a third FET device having a third gate structure over a third channel region and adjacent to the second gate structure, such that the third FET device shares the second source region and the second drain region of the second FET device. Each of the second FET device and third FET device may operate as depletion mode devices and can be used to regulate the introduction of high-voltages to the first FET device (the switching FET, in this example configuration). By arranging the high-voltage depletion FETs adjacent to one another such that they share source and drain regions, further space savings is achieved on the given die or chip.

According to another example embodiment, a memory device includes a memory array having a plurality of memory cells, such as a FLASH memory array addressable in a row-column format. At least one high-voltage switching device is coupled to at least a portion of the plurality of memory cells. The high-voltage switching device may be used to provide an erase voltage (e.g., 20-30 volts) to those memory cells that are to have their stored charge wiped away. The high-voltage switching device can include a semiconductor layer having the doping profile of any of the embodiments discussed previously, and at least first and second FET or other transistor devices similar to the first and second FET devices described in any of the embodiments discussed previously.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y.

It should be readily understood that the meaning of "above" and "over" in the present disclosure should be interpreted in the broadest manner such that "above" and "over" not only mean "directly on" something but also include the meaning of over something with an intermediate feature or a layer therebetween. Additionally, the meaning of "on" in the present disclosure should be interpreted to mean directly on something (i.e., having no intermediate feature or layer therebetween.)

Further, spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer. In still other embodiments, a substrate may include multiple layers, such as a base layer (e.g., bulk silicon wafer), a single crystalline top layer (e.g., monocrystalline silicon), and a buried insulator layer (e.g., silicon dioxide) between the base and top layers. As will be appreciated, any number of substrate configurations can be used with the techniques provided herein. Furthermore, when reference is made to a substrate in the following description, previous process steps may have been utilized to form regions/junctions in the base substrate structure, and the term substrate can include the underlying layers containing such regions/junctions.

As used herein, the term "layer" refers to a material portion including a region with a thickness. A monolayer is a layer that consists of a single layer of atoms of a given material. A layer can extend over the entirety of an underlying or overlying structure or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer. A substrate can be a layer, can include one or more layers therein, and/or can have one or more layer thereupon, thereabove, and/or therebelow.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In some example embodiments, such tools may indicate the presence of a commonly doped (i.e., same dopant type) well region in a semiconductor layer beneath a p-channel high-voltage FET and a neighboring n-channel high-voltage FET, as variously described herein. Numerous configurations and variations will be apparent in light of this disclosure.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Architecture

FIG. 1 is a block diagram of a NAND flash memory device 100 in communication with a processor 130 as part of an electronic system, according to an embodiment. Processor 130 may be a memory controller or other external host device. As can be seen in this example embodiment, memory device 100 includes an array of memory cells 104. A row decoder 108 and a column decoder 110 are provided to decode address signals. Address signals are received and decoded to access memory array 104. Memory device 100 further includes input/output (I/O) control circuitry 112 to manage input of commands, addresses, and data to memory device 100 as well as output of data and status information from memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to memory array 104 in response to the commands and generates status information for the external processor 130. Control logic 116 is in communication with row decoder 108 and column decoder 110 to control the row decoder 108 and column decoder 110 in response to the addresses. Additionally, control logic 116 may issue erase commands that trigger activation of one or more high-voltage switching devices within row decoder 108 and column decoder 110. In other examples, the one or more high-voltage switching devices are located separately from row decoder 108 and column decoder 110, such as within memory array 104. As can further be seen, control logic 116 is also in communication with a cache register 118. Cache register 118 latches data, either incoming or outgoing, as directed by control logic 116 to temporarily store data while memory array 104 is busy writing or reading, respectively, other data. During a write operation, data is passed from cache register 118 to data register 120 for transfer to memory array 104; then new data is latched in cache register 118 from I/O control circuitry 112. During a read operation, data is passed from cache register 118 to I/O control circuitry 112 for output to external processor 130; then new data is passed from data register 120 to cache register 118. A status register 122 is in communication with I/O control circuitry 112 and control logic 116 to latch the status information for output to processor 130.

Memory device 100 receives control signals at control logic 116 from processor 130 over a control link 132. The control signals may include at least a chip enable CE #, a command latch enable CLE, an address latch enable ALE, and a write enable WE #. Memory device 100 receives command signals (which represent commands), address signals (which represent addresses), and data signals (which represent data) from processor 130 over a multiplexed I/O bus 134 and outputs data to processor 130 over I/O bus 134. For example, in some specific such example embodiments, the commands are received over I/O pins [7:0] of I/O bus 134 at I/O control circuitry 112 and are written into command register 124. The addresses are received over I/O pins [7:0] of bus 134 at I/O control circuitry 112 and are written into address register 114. The data are received over I/O pins [7:0] for an 8-bit device or I/O pins [15:0] for a 16-bit device at I/O at control circuitry 112 and are written into cache register 118. The data are subsequently written into data register 120 for programming memory array 104. In another embodiment, cache register 118 may be omitted, and data is written directly into data register 120. Data may also be output over I/O pins [7:0] for an 8-bit device or I/O pins [15:0] for a 16-bit device.

It will be appreciated that the memory device of FIG. 1 may include additional circuitry and signals, and that the functional blocks of the memory device may not necessarily be segregated as shown in this example case. For example, a single component or component portion of an integrated circuit device could be adapted to perform the functionality of more than one block component of FIG. 1. Alternatively, or in addition, functionality of a single block component of FIG. 1 may be distributed into multiple blocks. Additionally, while specific I/O pins are described in accordance with popular conventions for receipt and output of the various signals, it is noted that other combinations or numbers of I/O pins may be used in the various embodiments. Many variations will be appreciated.

High-Voltage Switch

Figure 2:
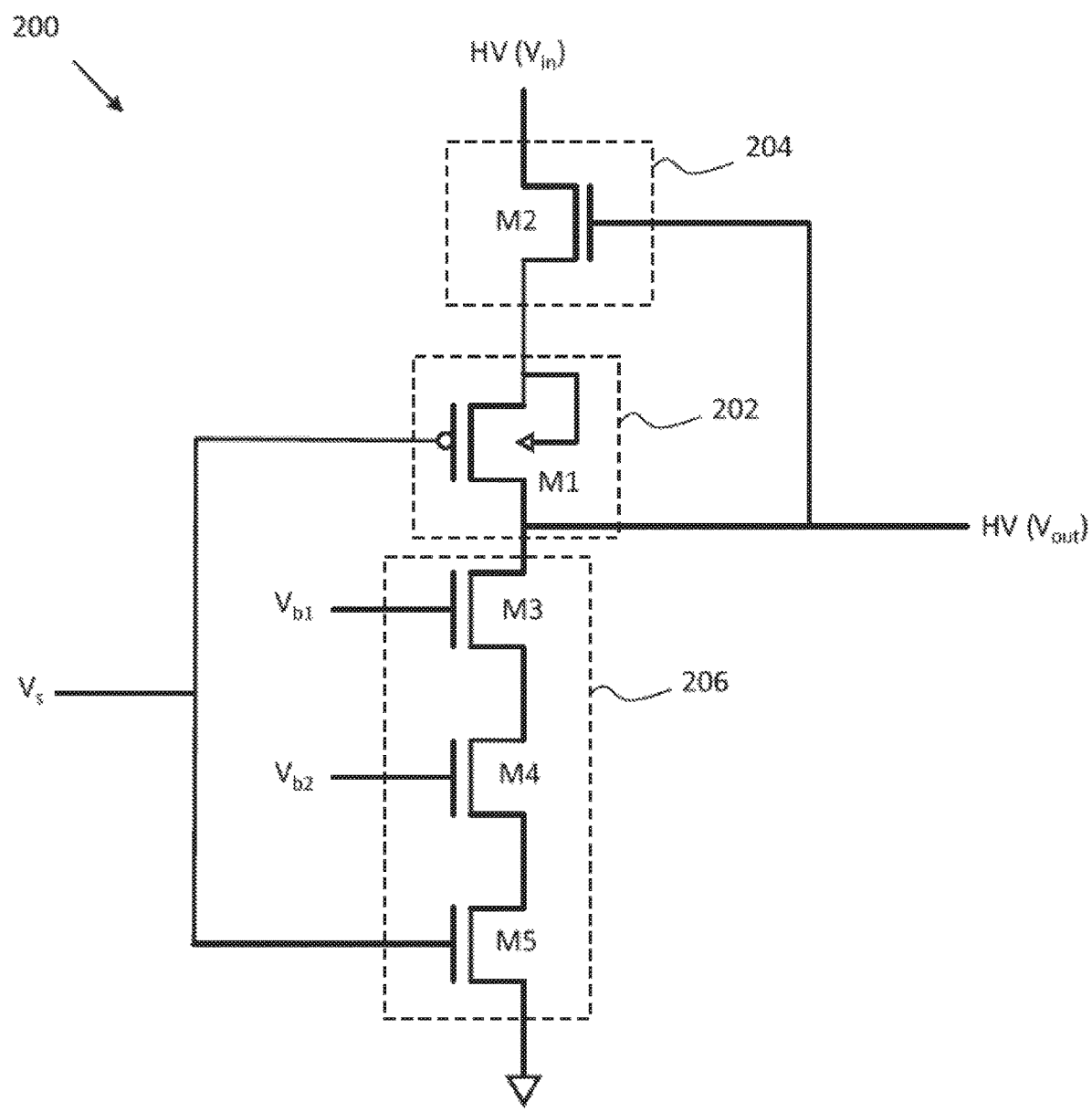
FIG. 2 illustrates a schematic diagram of an example high-voltage switching circuit, in accordance with an embodiment of the present disclosure.

FIG. 2 illustrates a circuit diagram of an example high-voltage (HV) switching device 200, according to an embodiment. As can be seen, HV switching device 200 includes a plurality of transistors (FETs, in this example case) designed to pass a high-voltage input ($V_{in}$) to the high-voltage output ($V_{out}$) upon reception of a switching signal ($V_s$). According to some embodiments, HV switching device 200 includes a switching block 202, a depletion block 204, and a discharge block 206. Any of switching block 202, depletion block 204, and discharge block 206 can include any number of transistors, although in some embodiments switching block 202 includes just a single high-voltage FET. Each of the FETs of depletion block 204 and discharge block 206 may have an opposite polarity to the FET of switching block 202. That is, in one example, M1 is a p-channel FET while M2 through M5 are n-channel FETs, and in another example M1 is an n-channel FET while M2 through M5 are p-channel FETs.

The one or more transistors of depletion block 204 are designed to be depletion-mode FETs in this example, meaning that they are biased on when the gate-source voltage is zero. The high-voltage input is received at a drain terminal of at least one of the FETs in depletion block 204, such as FET M2 in this example. Additionally, the HV output $V_{out}$ is connected to the gate terminal of M2 while the source terminal of M2 is connected to the source terminal of FET M1 from switching block 202. According to some embodiments, M2 is a high-voltage depletion-mode FET that acts as a high-voltage load with a variable conductivity based on the applied $V_{out}$ voltage. Such devices aid the transfer of high-voltages when using smaller switching voltages (e.g., $V_s \ll V_{in}$, $V_{out}$). In some embodiments, other high-voltage depletion-mode FETs can be connected with M2 in a parallel arrangement within depletion block 204.

Switching block 202 includes at least one p-channel HV FET M1, according to an embodiment. The output voltage is collected from the drain terminal of M1, while the switching signal $V_s$ is connected to the gate terminal of M1. Since M1 is a p-channel device, the switch is activated when $V_s$ is a low logic level. The source terminal of M1 may be connected with the body of M1.

Discharge block 206 includes one or more transistors coupled in a series arrangement to the drain terminal of M1, according to an embodiment. The transistors of discharge block 206 pull the drain node of M1 down to ground (thus grounding $V_{out}$) when M1 is off. According to some embodiments, both M3 and M4 are high-voltage (HV) FET devices while M5 is a low-voltage (LV) FET device. HV FETs have a thicker gate dielectric compared to LV FETs as will be discussed in turn. M3 and M4 both receive bias voltages Vb1 and Vb2, respectively, at their gate terminals to bias both devices on. The gate terminal of M5 is connected to $V_s$ such that M5 is on when M1 is off, thus pulling $V_{out}$ to ground, and M5 is off when M1 is on to isolate $V_{out}$ from ground.

According to some embodiments of the present disclosure, the active semiconductor region beneath at least M1 and M2 includes a common n-type well (that may include more than one doped n-type region), which saves space when fabricating the FETs of switching block 202 and depletion block 204. The active areas between M1 and M3 may be isolated from one another using shallow trench isolation or by fabricating an additional isolation FET, in accordance with some embodiments.

Figure 3:
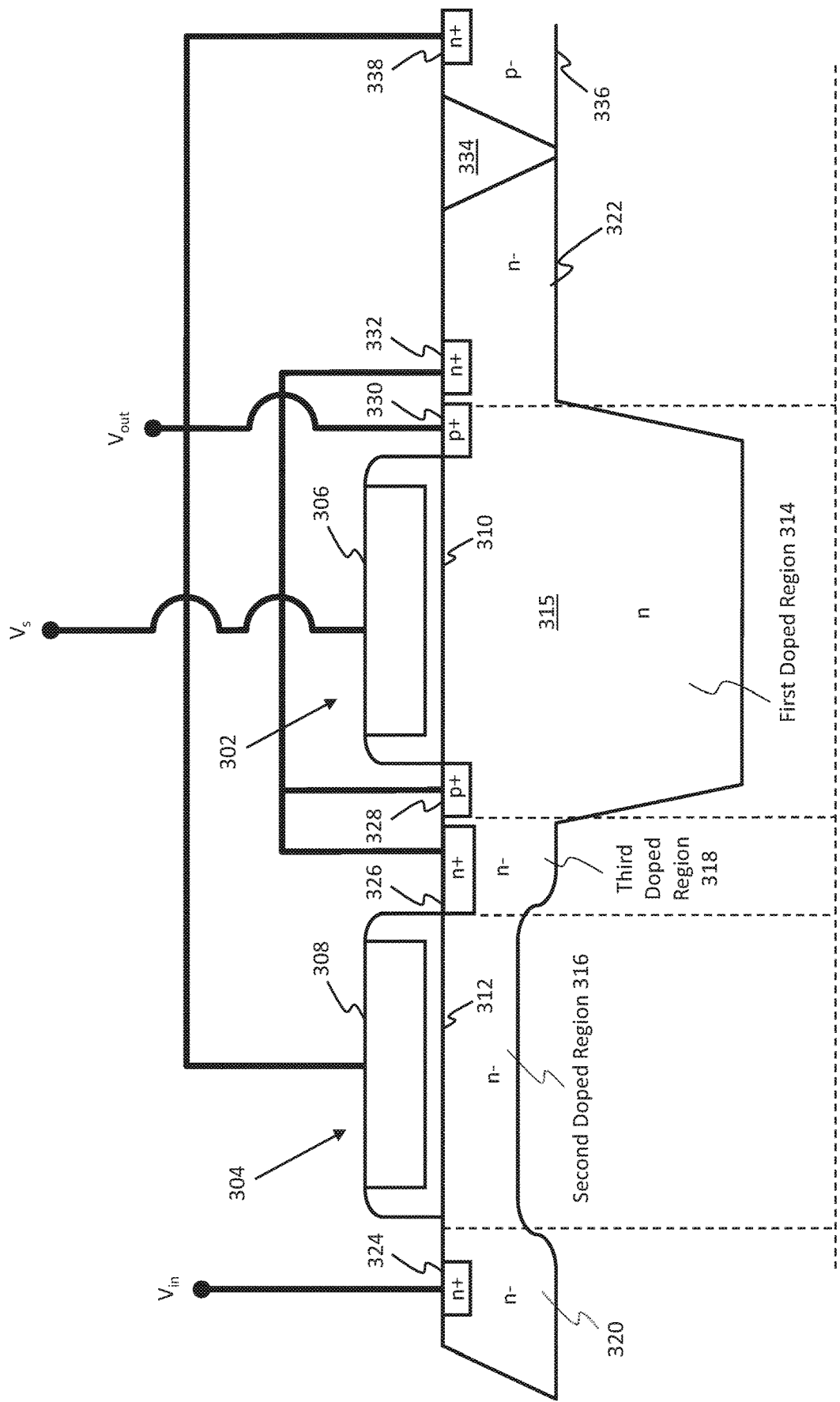
FIG. 3 illustrates a side cross-section view of an integrated circuit that includes a switching device, in accordance with an embodiment of the present disclosure.

FIG. 3 illustrates a cross-section view of a portion of HV switching device 200, according to an embodiment. Various doped regions within a semiconductor layer 315 are observed beneath a first FET 302 and a second FET 304. As can be seen, the doped regions include a first doped region 314, a second doped region 316, and a third doped region 318. According to some embodiments, first FET 302 represents M1 in FIG. 2 while second FET 304 represents M2 in FIG. 2. FIG. 3 also illustrates various connections made between portions of FET 302, FET 304, and doped regions within the semiconductor layer 315. Note that FET 302 and FET 304 may represent, for example, a planar metal-oxide-semiconductor field-effect transistors (MOSFETs). In other embodiments, FET 302 and FET 304 may be non-planar transistors such as finFETs. In a more general sense, any number of transistor types and topologies and combinations thereof can be used to implement the techniques provided herein, as will be appreciated.

As can be further seen, FET 302 includes a gate electrode 306 and a gate dielectric 310 between gate electrode 306 and the underlying semiconductor layer 315. Similarly, FET 304 includes gate electrode 308 and a gate dielectric 312 between gate electrode 308 and the underlying semiconductor layer 315. Either or both of gate electrode 306 and gate electrode 308 can include any number of conductive layers, such as polysilicon or tungsten, and work function materials (e.g., titanium nitride). The gate electrodes 306 and 308 may be doped as well, in some cases. In some embodiments, either or both of gate electrode 306 and gate electrode 308 includes a silicide or resistance-reducing layer on top to provide an enhanced ohmic contact with a contact structure. In some embodiments, either or both of gate electrode 306 and gate electrode 308 includes a pure metal gate structure. Either or both of gate dielectric 310 and gate dielectric 312 can include any number of deposited or grown dielectric materials compatible for use with a MOSFET. Example gate dielectric materials include silicon dioxide, silicon nitride, hafnium oxide, or any high-k dielectric material. In some cases, gate dielectrics 310 and 312 include a first layer of silicon dioxide on layer 315 and a second layer of high-k material such as hafnium oxide or aluminum oxide on the silicon dioxide layer. Any number of gate electrode and gate dielectric materials can be used, as will be appreciated.

According to some embodiments, both FET 302 and FET 304 are HV FETs as they pass a high-voltage signal between their respective source and drain. Accordingly, such HV FETs may have a thicker gate oxide 310 and 312 than traditional FETs that handle lower-voltage signals. For example, gate dielectrics 310 and 312 may each have a thickness greater than 350 Å while a LV FET may have a gate dielectric thickness of less than 100 Å.

The doped semiconductor layer 315 may be a portion of a larger bulk semiconductor substrate, in some embodiments. In other embodiments, the semiconductor layer 315 is a top layer of a semiconductor-on-insulator (SOI) substrate or other multilayer substrate configuration (such as a layer of single crystal silicon). The substrate may include, for example, silicon, germanium, or a III-V material combination such as gallium arsenide or indium phosphide. The substrate may be natively undoped, p-type doped, or n-type doped. In the example illustrated in FIG. 3, the substrate is p-type doped and the various doped regions of layer 315 beneath FET 302 and FET 304 are n-type doped.

As discussed above, different regions of the semiconductor layer 315 beneath FETs 302 and 304 are doped in order to form a continuous n-well area that connects between both FET 302 and FET 304, according to an embodiment. Example n-type dopants include, for instance, phosphorous, arsenic, or a combination of the two. Example p-type dopants include, for instance, boron. Example doping technologies include beamline and plasma doping (PLAD). PLAD may be used for shallow implants, while beamline may be used for deeper implants. Beamline may be done at an angle (e.g., 7°) to avoid channeling (causing a tail of atoms to go too deep into the substrate). Doping energies may be, for example, in the 300 keV-1000 keV energy range, as will be appreciated in light of this disclosure.

According to an embodiment, the first doped region 314 is formed beneath FET 302 or at least formed beneath gate electrode 306. First doped region 314 may be generally n-type doped and can include multiple doping steps of different energies and/or different dopants (e.g., phosphorous or arsenic). First doped region 314 may extend into the semiconductor layer beneath FET 302 to a depth between about 1000 nanometers (nm) and about 1500 nm, according to some example embodiments.

According to an embodiment, the second doped region 316 is formed beneath FET 304 or at least beneath gate electrode 308. Second doped region 316 has the same dopant type as first doped region 314, but may have a different concentration. In some embodiments, second doped region 316 is formed by implanting the dopant ions through FET 304, such that gate electrode 308 and second doped region 316 are similarly doped. Second doped region 316 may extend into the semiconductor layer beneath FET 304 to a depth between about 200 nm and about 400 nm, according to some example embodiments.

As can be further seen in this example embodiment, a third doped region 318 is formed between first doped region 314 and second doped region 316 such that it forms a conductive pathway between first doped region 314 and second doped region 316. Third doped region 318 includes the same dopant type as both first doped region 314 and second doped region 316 (e.g., all three doped regions are either n-type or p-type). Third doped region 318 may extend into the semiconductor layer to a depth between about 300 nm and about 600 nm, according to some example embodiments. Using this dopant scheme, no isolation is used within the semiconductor layer between FET 302 and FET 304. Instead, a common n-well exists between both FETs. Other doped regions 320 and 322 may be similar to third doped region 318. In some embodiments, at least each of doped regions 318, 320, and 322 are formed at the same time (e.g., during the same dopant implantation process).

Smaller, highly concentrated doped regions are also formed as source and drain regions for each of FET 302 and FET 304. In the example case shown, drain region 324 and source region 326 of FET 304 are each n-type doped regions having a higher dopant concentration than any of first, second, or third doped regions. As previously noted, drain region 324 and source region 326 may be implantation doped portions of layer 315, or alternatively doped in situ during epitaxial deposition of source/drain material into corresponding recesses of layer 315. Note that FET 304 includes n-type source and drain regions with an n-type active area beneath gate electrode 308, which allows the device to be operated in a depletion mode. Also, as seen in FIG. 3, note that drain region 324 and source region 326 do not need to be aligned to the edge of gate electrode 308 (or to the edge of gate spacers around gate electrode 308, if present). In some embodiments, drain region 324 is spaced some distance from the edge of FET 304 to provide a larger tolerance for contacting drain region 324. As can be further seen in this example case, source region 328 and drain region 330 of FET 302 are each p-type doped regions having a higher dopant concentration than any of first, second, or third doped regions. Source region 328 and drain region 330 are self-aligned with the edge of gate electrode 306 (or to the edge of gate spacers around gate electrode 306, if present), in this example case.

According to some embodiments, an additional highly doped region 332 may be included adjacent to drain region 330. Doped region 332 may have the same dopant type with the same concentration as drain region 324 and source region 326. Doped region 332 may be separated from drain region 330 by, for example, 100 nm or more, or 200 nm or more. Similarly, source region 326 may be separated from source region 328 by, for example, 100 nm or more, or 200 nm or more. In some example embodiments, a shallow trench isolation (STI) structure is present between doped region 332 and drain region 330 and/or between source region 326 and source region 328, to provide electrical isolation.

As noted above, the merged n-well region beneath FET 302 and FET 304 is isolated from another n-type region 336 used for the discharge FET devices of discharge block 206. To this end, a shallow trench isolation (STI) structure 334 may be included that extends into the semiconductor layer 315 to a depth at least deep enough to effectively isolate n-type region 322 from n-type region 336. For example, STI structure 334 may extend through at least a portion of the semiconductor layer 315 and at a depth at least as deep as a total thickness of third doped region 318 (which may be similar to the thickness of doped regions 320 and 322). STI structure 334 may include silicon oxide or any other suitable insulator material (e.g., porous oxide). As can be further seen, a heavily doped n-type region 338 is provided which acts as a drain for one of the discharge FETs.

The HV input $V_{in}$ is received at drain region 324. In some embodiments, $V_{in}$ has a magnitude of at least 20 volts or at least 30 volts, although any number of high-voltage inputs can be used. According to an embodiment, when FET 302 is off (e.g., $V_s$ is at logic level high around 2.8 to 5 volts), doped regions 326, 328, and 332 downstream from drain region 324 are at substantially the same low potential (e.g., less than 4 volts) due to the depletion-mode operation of FET 304, while drain region 330 is pulled to ground via one or more coupled discharge FETs. In some embodiments, doped region 332 is also connected to source regions 326 and 328.

Gate electrode 306 is connected to a switching input $V_s$. When $V_s$ is set to a logic level low (e.g., zero volts), FET 302 turns on and begins to conduct between source region 328 and drain region 330. In this way, the HV $V_{in}$ is received at $V_{out}$. Gate electrode 308 also receives $V_{out}$ as a feedback mechanism, according to an embodiment. When high $V_{out}$ voltage is applied to gate electrode 308 (e.g., FET 302 is on), FET 304 forms a higher conductive pathway to aid in transferring the high-voltage input from drain region 324 to drain region 330. $V_{out}$ is also received by drain region 338 of one of the discharge devices so that it can be grounded during the time that FET 302 is off.

Although lines are illustrated to show electrical connections between various ones of the gates and doped regions, it should be understood that the lines represent metal interconnect structures. Such metal interconnect structures will be understood to include metal contacts (e.g., vias) extending through a dielectric layer to make contact with the gates and doped regions, and patterned metal traces to route signals between the components. The metal contacts and metal traces may be built up above the semiconductor layer 315 in any number levels, as will be appreciated.

Figure 4:
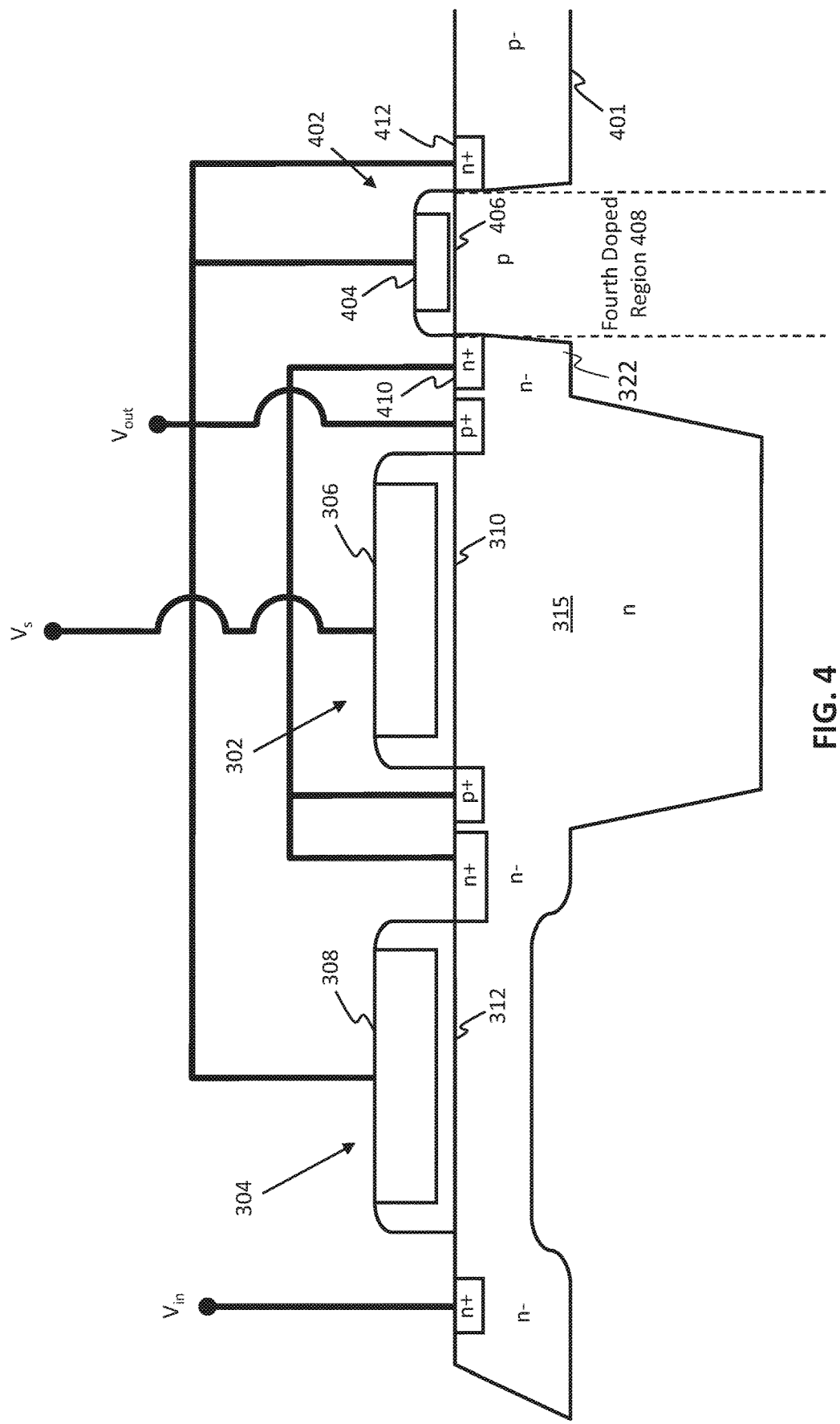
FIG. 4 illustrates a side cross-section view of an integrated circuit that includes a switching device, in accordance with another embodiment of the present disclosure.

FIG. 4 illustrates a cross-section view of a portion of HV switching device 200, according to another embodiment. Many of the same structures from FIG. 3 are repeated in FIG. 4, and thus are not all labeled again for clarity. Unless otherwise specified, all like-labeled structures of FIG. 4 have the same features as previously discussed above in FIG. 3. As can be further seen, FIG. 4 includes a different isolation structure for separating the n-type regions under FETs 302 and 304 from the n-type region 401.

In more detail, and according to this example embodiment, an isolation FET 402 is provided that includes a gate electrode 404 and gate dielectric 406. Gate electrode 404 may use similar materials to either of gate electrodes 306 or 308. In some embodiments, gate electrode 404 is thinner than either of gate electrodes 306 or 308. Additionally, in some embodiments, gate dielectric 406 may use similar materials to either of gate dielectrics 310 or 312 but is thinner than either of gate dielectric 310 or 312. For example, in some such example embodiments, gate dielectric 406 is between 50% and 90% thinner than either of gate dielectric 310 or gate dielectric 312.

As can be further seen, gate electrode 404 and gate dielectric 406 are over a p-type doped region 408 that separates doped region 322 from doped region 401 within the semiconductor layer. In some embodiments, doped region 408 is aligned directly beneath gate electrode 404 (or aligned beneath gate electrode 404 and spacers on either side of gate electrode 404). Isolation FET 402 also includes an n-type doped drain region 410 and an n-type doped source region 412. Drain region 410 may be connected to the source regions of FETs 302 and 304 (similar to doped region 332 from FIG. 3). Gate electrode 404 and source region 412 may be connected together and further connected to $V_{out}$. Thus, when $V_{out}$ is grounded (FET 302 is off) gate electrode 404 is similarly grounded and isolation FET 402 is off to protect doped region 401 from any high-voltage potential resulting from $V_{in}$. Furthermore, when $V_{out}$ is at a high potential (FET 302 is on), each of drain region 410, source region 412, and gate electrode 404 is at roughly the same $V_{out}$ potential. Since $V_{GS}$ in this situation is near zero, isolation FET 402 will still not conduct and will protect doped region 401 from the high-voltage potential. In some embodiments, source region 412 is shared by a discharge FET device over doped region 401 (e.g., source region 412 acts as a drain region for the discharge FET device). The discharge FETs are not illustrated in FIG. 3 or 4 but are shown in FIG. 2.

Each of FIGS. 5A-5H illustrate top-down views of different designs for HV switching device 200, according to some embodiments. For example, some designs use a different number or arrangement of depletion FETs, a different number or arrangement of discharge devices, different isolation structures, or any combination thereof. The larger white boxes represent gate structures for different FET devices while the dotted line boxes represent doped regions in the semiconductor layer. Reference may be made to the different FETs and doped regions of HV switching device 200 as illustrated in FIGS. 2 and 3.

Figure 5B:
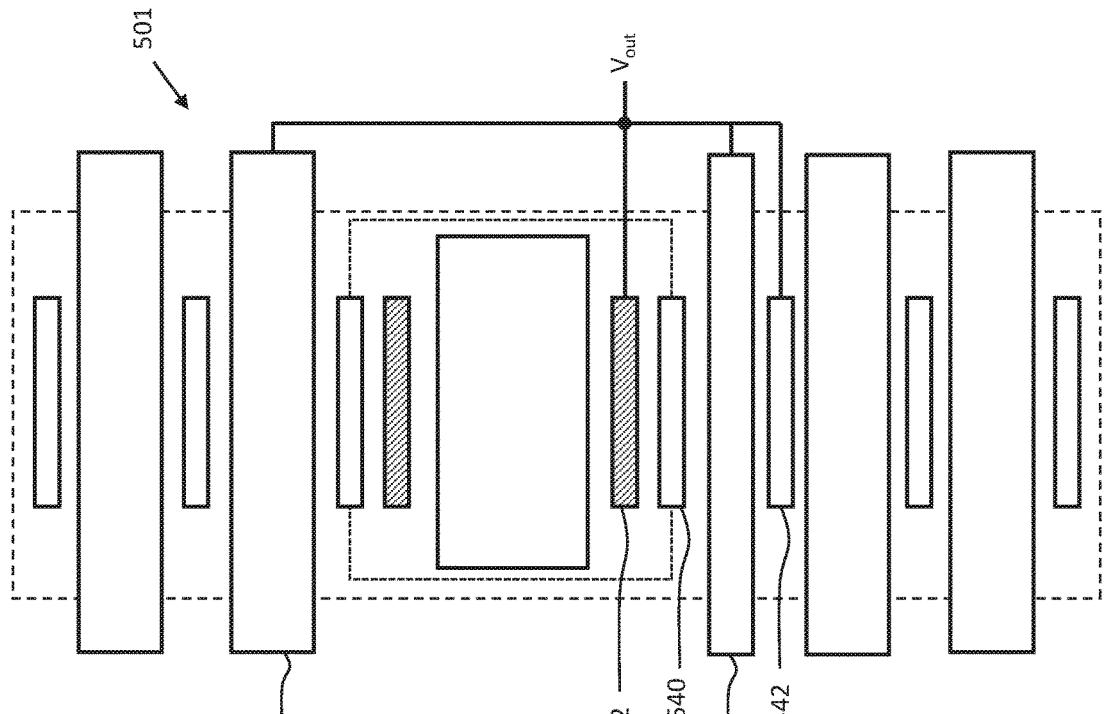
Figure 5A:
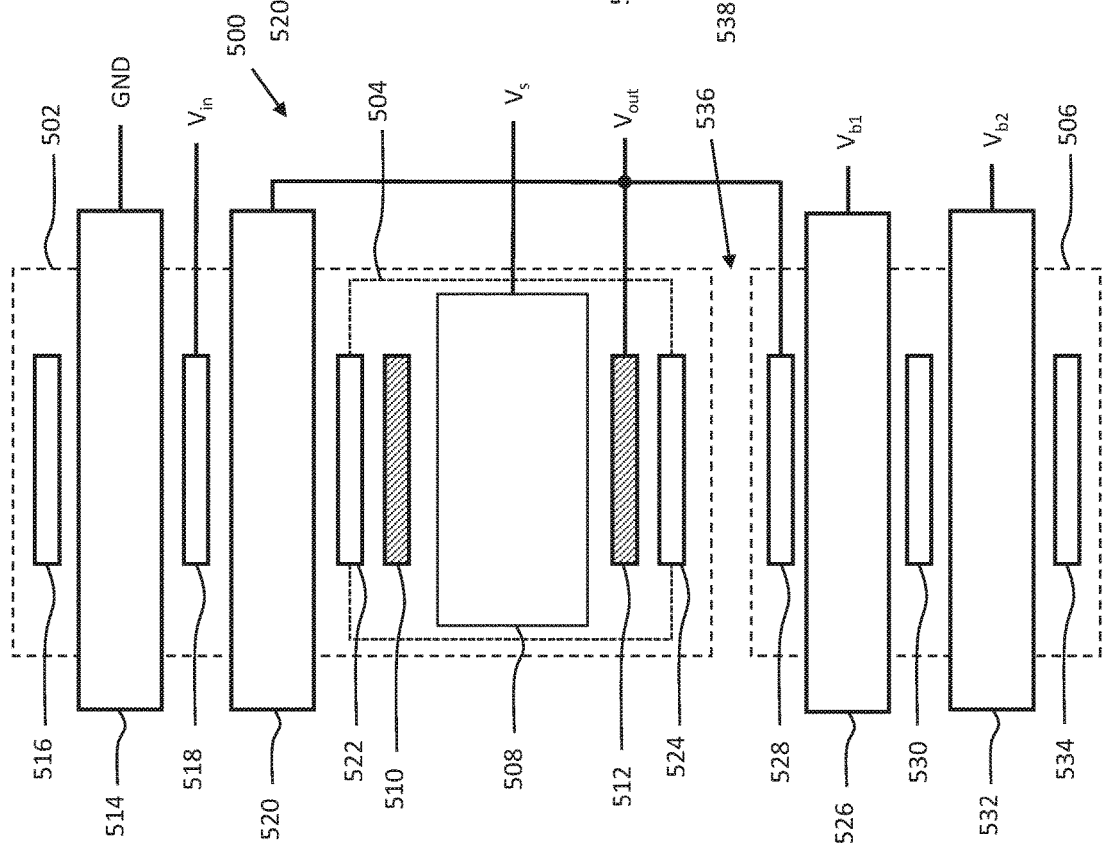

FIG. 5A illustrates a top-down view of a first layout 500 of HV switching device 200 illustrating the relative locations of some of the doped regions and gate structures, according to an embodiment. An n-doped region 502 may represent the various n-type regions (e.g., regions 316, 318, 320, and 322) that exist beneath the depletion FETs and the p-channel switching FET. A deeper n-type region 504 represents the deep implant beneath the switching FET (e.g., n-type region 314). A p-type region 506 represents a p-well formed beneath one or more of the discharge devices.

A switching FET (e.g., M1) includes a gate structure 508, a source region 510 and a drain region 512. Source region 510 and drain region 512 are each doped to have the opposite dopant type from doped region 504. First layout 500 includes two depletion FETs with a first depletion FET having a gate structure 514, a source region 516 and a drain region 518. A second depletion FET includes a gate structure 520 and shares its drain region 518 with the first depletion FET. The second depletion FET also includes a source region 522. The two depletion FETs may be arranged in a cascode configuration by electrically connecting source region 516 with source region 522. Drain region 518 receives the high-voltage input $V_{in}$, according to an embodiment. Gate structure 514 of the first depletion FET may be grounded.

An additional doped region 524 may be present and is analogous to doped region 332 from FIG. 3. The discharge devices include two discharge FETs, with a first discharge FET having a gate structure 526, a drain region 528 and a source region 530. A second discharge FET includes a gate structure 532, a drain region 530 (shared with source region 530 from the first discharge FET) and a source region 534. According to an embodiment, each of the discharge FETs, depletion FETs and the switching FET is a high-voltage FET having a thicker gate oxide. In some embodiments, the second discharge FET with gate structure 532 is a LV FET having a thinner gate dielectric than any of the other FETs present in first layout 500. The gate structures of the two discharge FETs may be connected to bias potentials $V_{b1}$ and $V_{b2}$ to bias both discharge FETs on. In some embodiments, source region 534 of the second discharge FET is connected to a LV FET (e.g., M5) to compete the discharge pathway.

First layout 500 uses an STI structure 536 to separate the discharge FETs from the switching FET (e.g., separating doped regions 502 and 506). The $V_{out}$ node is connected to drain region 512 of the switching FET, drain region 528 of the first discharge FET, and gate structure 520 of the second depletion FET. A low-voltage (e.g., around 5 volts max) switching signal is applied to gate structure 508 of the switching FET.

FIG. 5B illustrates a top-down view of a second layout 501 of HV switching device 200, according to an embodiment. Most of the structures of second layout 501 are repeated from first layout 500. Second layout 501 differs from first layout 500 in that STI structure 536 has been replaced with an isolation FET having a gate structure 538, a drain region 540 and a source region 542. The isolation FET may have a thinner gate oxide compared to the other FETs of layout 501. The $V_{out}$ node is connected to drain region 512 of the switching FET, gate structure 520 of the second depletion FET, gate structure 538 of the isolation FET, and source region 542 of the isolation FET.

FIG. 5C illustrates a top-down view of a third layout 503 of HV switching device 200, according to an embodiment. Most of the structures of third layout 503 are repeated from first layout 500. In layout 503, the arrangement of the two depletion FETs is changed in order to provide further space savings on the chip. A first depletion FET includes a gate structure 544, a drain region 518, and a source region 522.

A second depletion FET includes a gate structure 546 and shares the same drain region 518 and source region 522 as the first depletion FET. According to an embodiment, both gate structures 544 and 546 are arranged adjacent to one another such that they each share portions of the same doped drain region 518 and source region 522. An STI structure 548 may be formed between gate structures 544 and 546 to provide sufficient isolation.

FIG. 5D illustrates a top-down view of a fourth layout 505 of HV switching device 200, according to an embodiment. Most of the structures of fourth layout 505 are repeated from third layout 503. Fourth layout 505 differs from third layout 503 in that STI structure 536 has been replaced with an isolation FET having a gate structure 538, a drain region 540 and a source region 542, as discussed above for second layout 501.

Figure 5F:
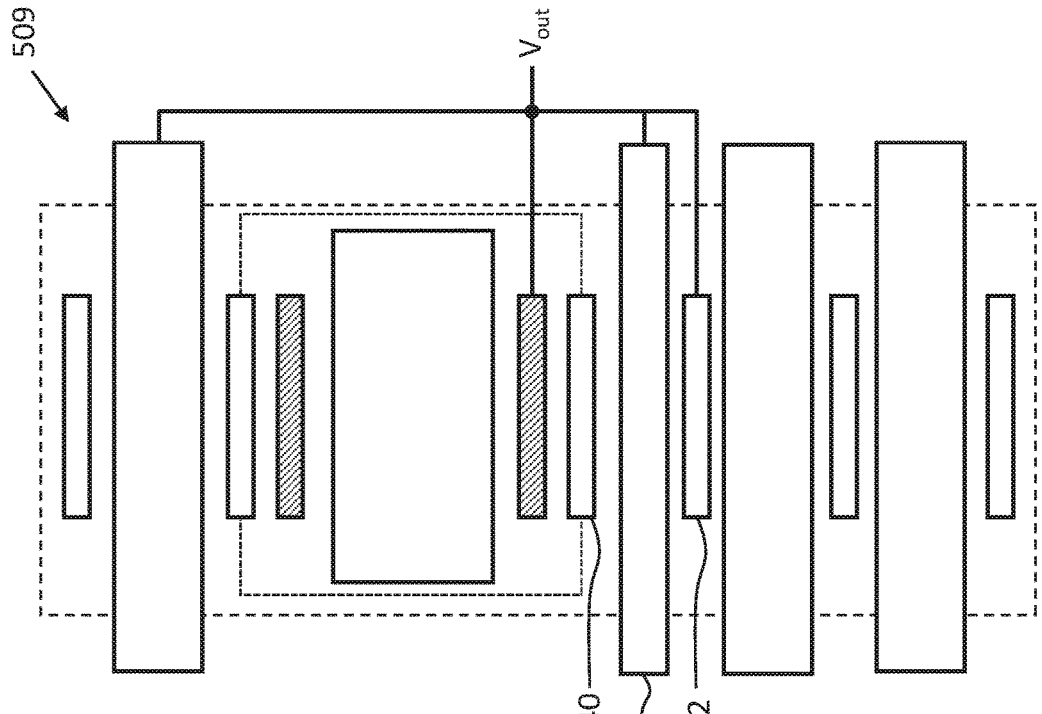
Figure 5E:
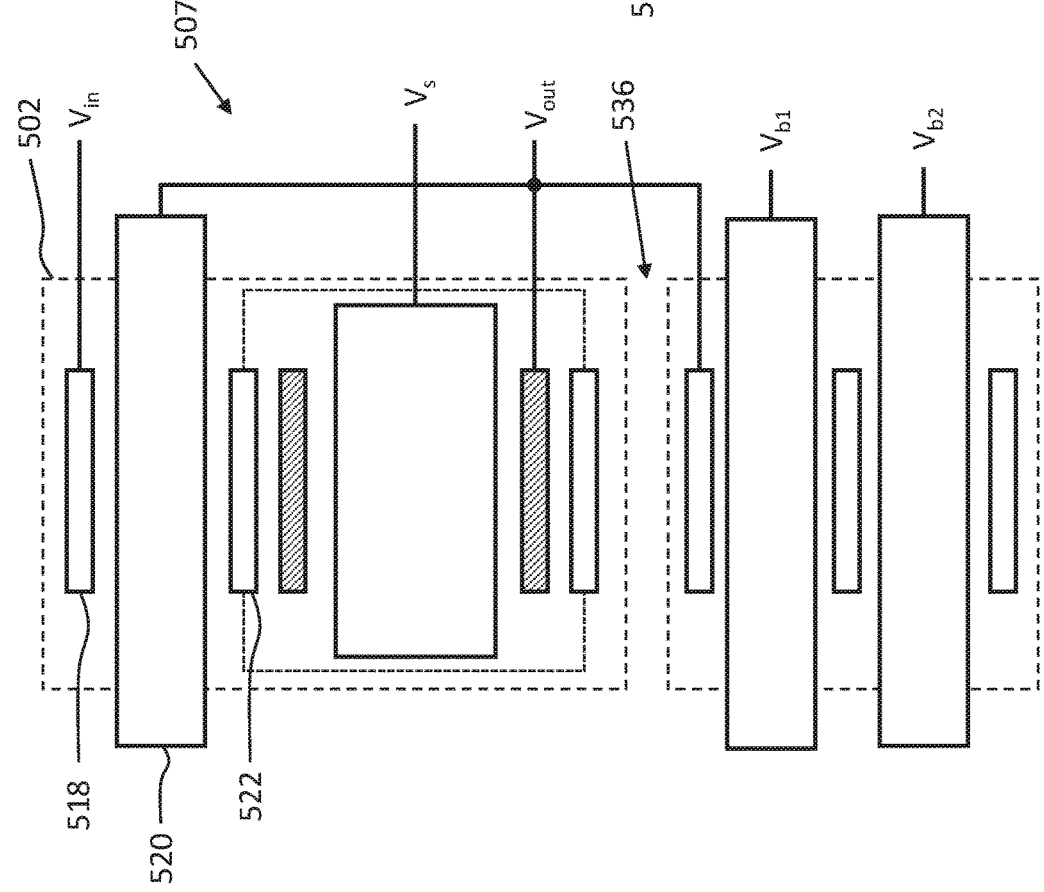

FIG. 5E illustrates a top-down view of a fifth layout 507 of HV switching device 200, according to an embodiment. Most of the structures of fifth layout 507 are repeated from first layout 500. Fifth layout 507 differs from first layout 500 in that one of the depletion FETs has been removed such that fifth layout 507 uses only one depletion FET having a gate structure 520, a drain region 518 and a source region 522. Using a single depletion FET further reduces the footprint of the overall switching device.

FIG. 5F illustrates a top-down view of a sixth layout 509 of HV switching device 200, according to an embodiment. Most of the structures of sixth layout 509 are repeated from fifth layout 507. Sixth layout 509 differs from fifth layout 507 in that STI structure 536 has been replaced with an isolation FET having a gate structure 538, a drain region 540 and a source region 542, as discussed above for second layout 501.

Figure 5H:
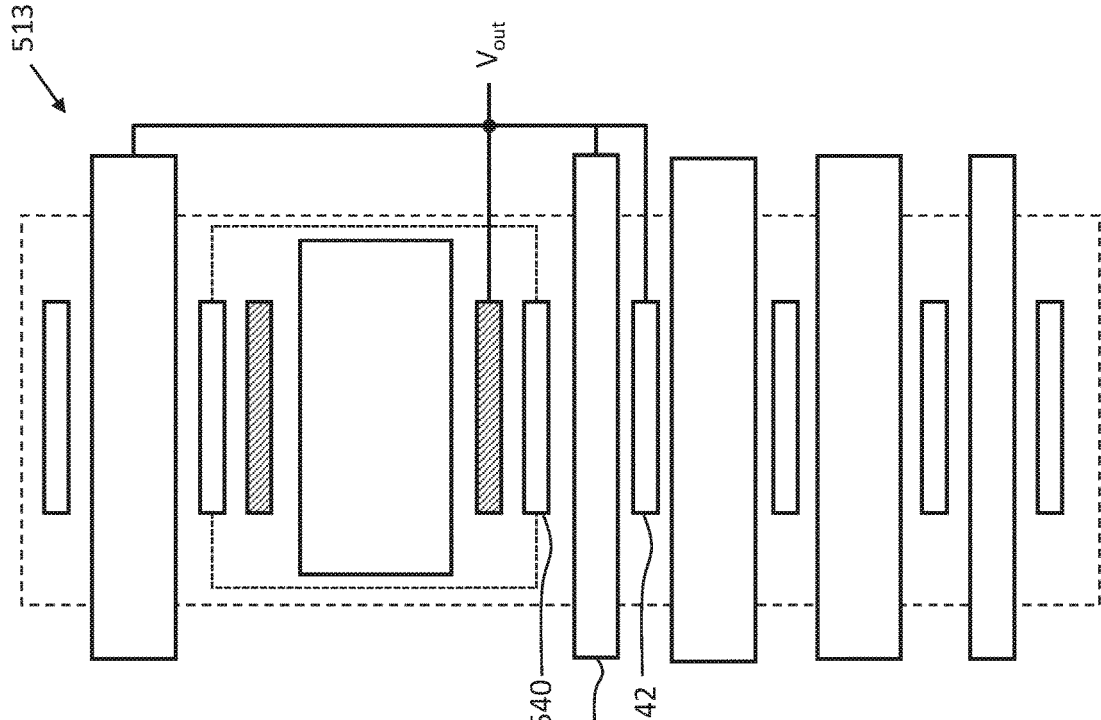
Figure 5G:
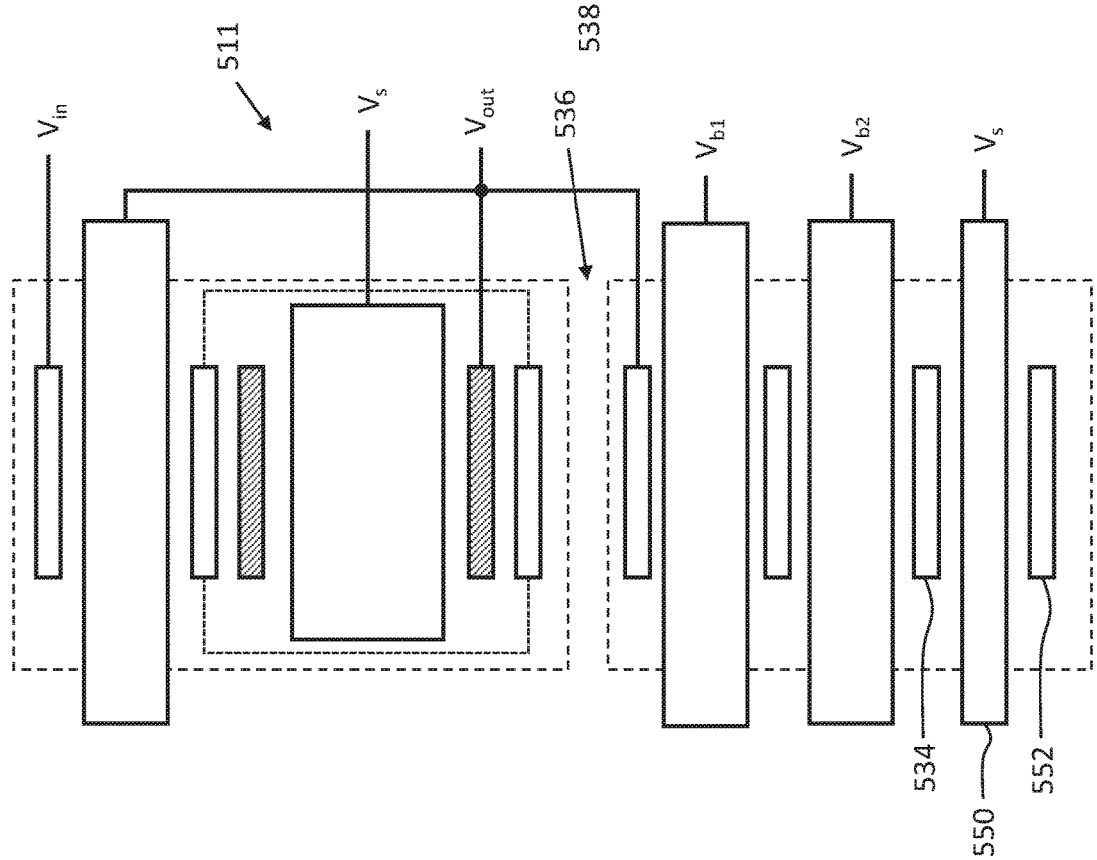

FIG. 5G illustrates a top-down view of a seventh layout 511 of HV switching device 200, according to an embodiment. Most of the structures of seventh layout 511 are repeated from fifth layout 507. Seventh layout 511 differs from fifth layout 507 in that an additional discharge FET (e.g., M5) has been added. The additional discharge FET includes a gate structure 550, a drain region 534 (shared with source region 534 from the second discharge FET), and a source region 552. According to an embodiment, the additional discharge FET is a LV FET having a thinner gate dielectric than any of the other FETs present in seventh layout 511. Gate structure 550 of the additional discharge FET may be connected to the switching potential $V_s$ in order to cut off the $V_{out}$ discharge path when the HV switch is on, and to ground $V_{out}$ when the HV switch is off.

FIG. 5H illustrates a top-down view of an eighth layout 513 of HV switching device 200, according to an embodiment. Most of the structures of eighth layout 513 are repeated from seventh layout 511. Eighth layout 513 differs from seventh layout 511 in that STI structure 536 has been replaced with an isolation FET having a gate structure 538, a drain region 540 and a source region 542, as discussed above for second layout 501.

Fabrication Process

FIGS. 6A-6H illustrate example operations in a fabrication process flow to form a HV switching device 600, according to an embodiment. It should be understood that not all process steps are illustrated for clarity and that some of the steps could be performed in a different order than the one presented here.

FIG. 6A illustrates a top-down view of a semiconductor layer 602 having STI strips 604 formed in semiconductor layer 602, according to an embodiment. Semiconductor layer 602 may be silicon, germanium, or a III-V material combination such as gallium arsenide or indium phosphide. Semiconductor layer 602 may be undoped, p-type doped, or n-type doped. STI strips 604 may be used to define the sides of the HV p-channel switching FET (e.g., M1) and can help to make the ends of the switching FET more defined.

Figure 6B:
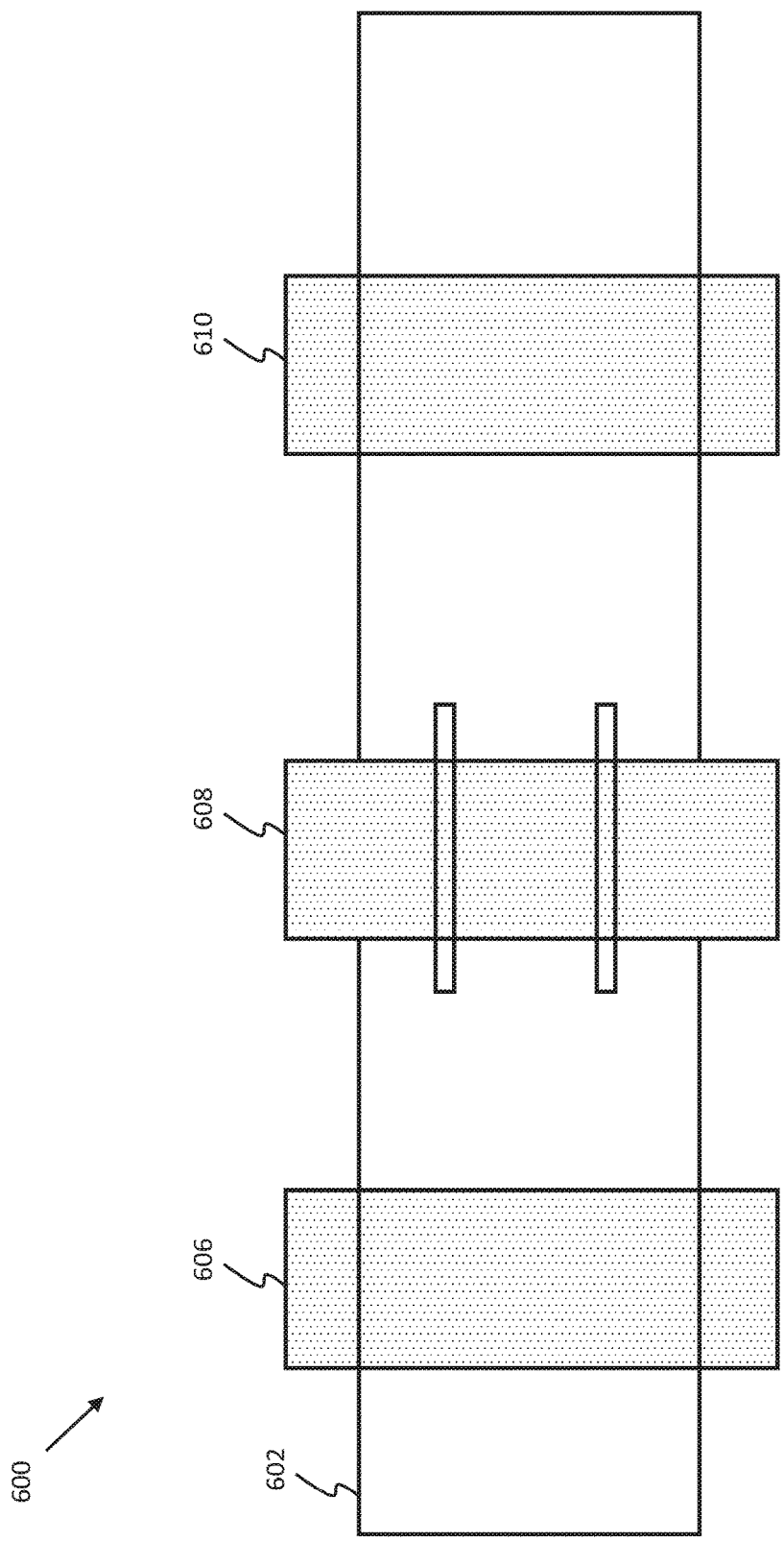

FIG. 6B illustrates a step in the fabrication of the HV switching device 600 where thick oxide regions 606, 608, and 610 are formed. These thick oxide regions define areas where HV FETs will be formed. Thick oxide regions 606, 608, and 610 will form the dielectric layers of the HV FETs, according to some embodiments. Note that the design in this illustration will include one depletion FET (using oxide 606), one switching FET (using oxide 608), and one discharge FET (using oxide 610). Other numbers of depletion FETs and discharge FETs could be used as well.

In some embodiments, thick oxide regions 606, 608, and 610 are formed by patterning a nitride mask to expose regions to grow the thicker oxide in the desired areas. In some embodiments, all other areas outside of thick oxide regions 606, 608, and 610 over semiconductor layer 602 would have a thinner oxide that can be used as the dielectric layer for any LV FETs.

Figure 6C:
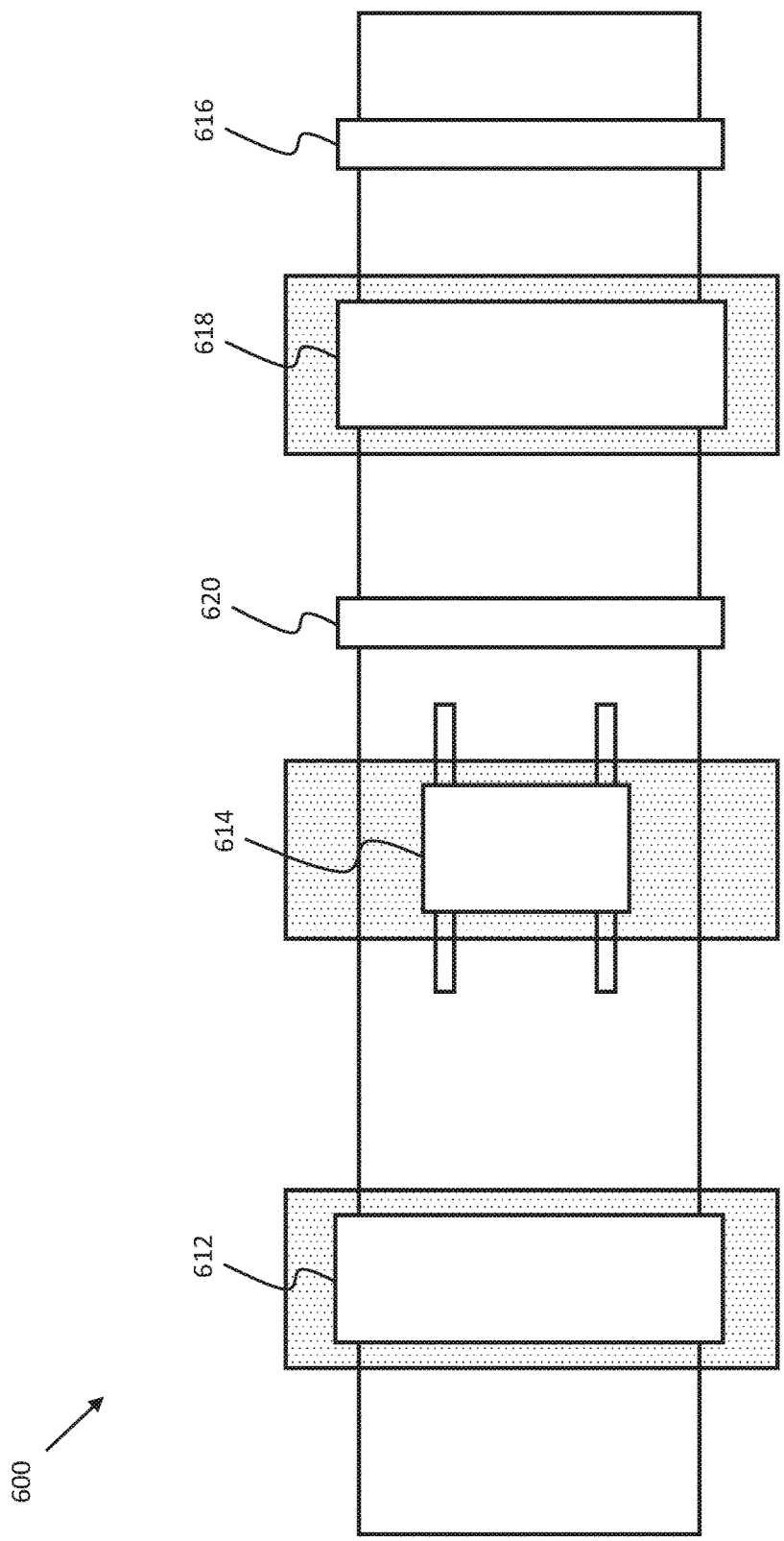

FIG. 6C illustrates a step in the fabrication of the HV switching device 600 where gate structures for the various FETs are formed. For example, gate structures 612, 614, and 618 are patterned over the thick oxide regions to form the gates of HV FETs while gate structures 616 and 620 are patterned over the thinner oxide to form the gates of LV FETs. Any of the gate structures can include any number of deposited conductive layers, such as deposited or grown polysilicon. The polysilicon may be formed with a dopant incorporated or doped at a later time after deposition.

Figure 6D:
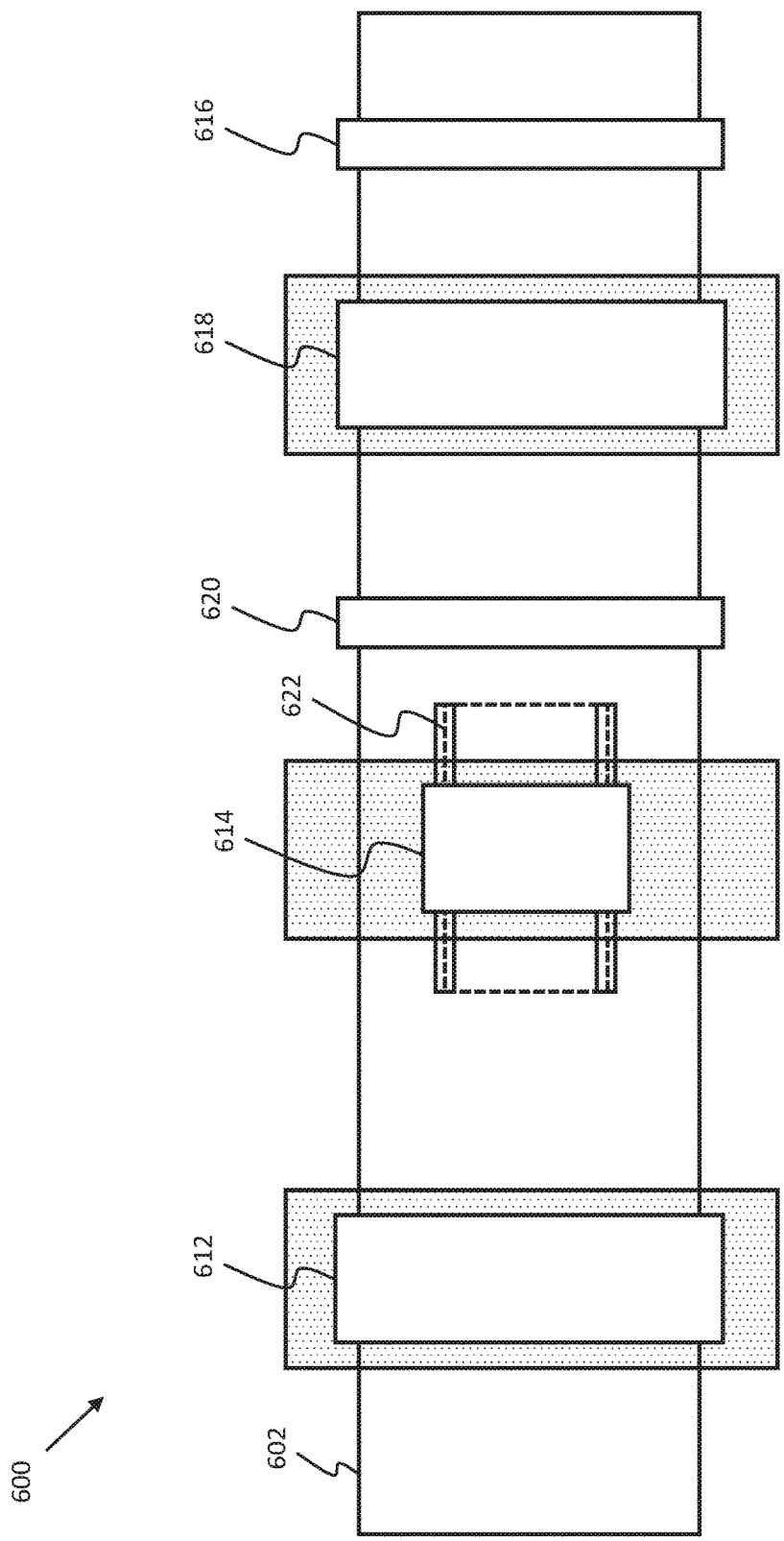

FIG. 6D illustrates a step in the fabrication of the HV switching device 600 where an n-type dopant is implanted everywhere except within the masked region 622, according to an embodiment. The n-type dopant may be phosphorous, arsenic, or some combination of the two. The implantation energy used may be enough to penetrate the oxide regions, but not high enough to penetrate through any of gate structures 612, 614, 616, 618, and 620. Accordingly, the resulting doped junctions are aligned to the edges of the gate structures. The doping may be performed before any gate spacer structure are formed. In one example, an implantation energy of around 60 keV may be used to implant phosphorus. According to some embodiments, the n-type dopant is implanted to form a junction depth within semiconductor layer 602 anywhere between 300 nm and about 600 nm. With reference to FIG. 3, the n-type doping step illustrated in FIG. 6D may be used to form at least doped regions 318, 320, 322, and 336.

In some embodiments, a p-type dopant is used instead to dope all areas except beneath the gate structures 612, 614, 616, 618, and 620 and within masked region 622. The p-type dopant may be provided in situations where an n-channel switching device is used. In some embodiments, masked region 622 is not used such that the dopant also dopes portions of semiconductor layer 602 around the edges of gate structure 614.

Figure 6E:
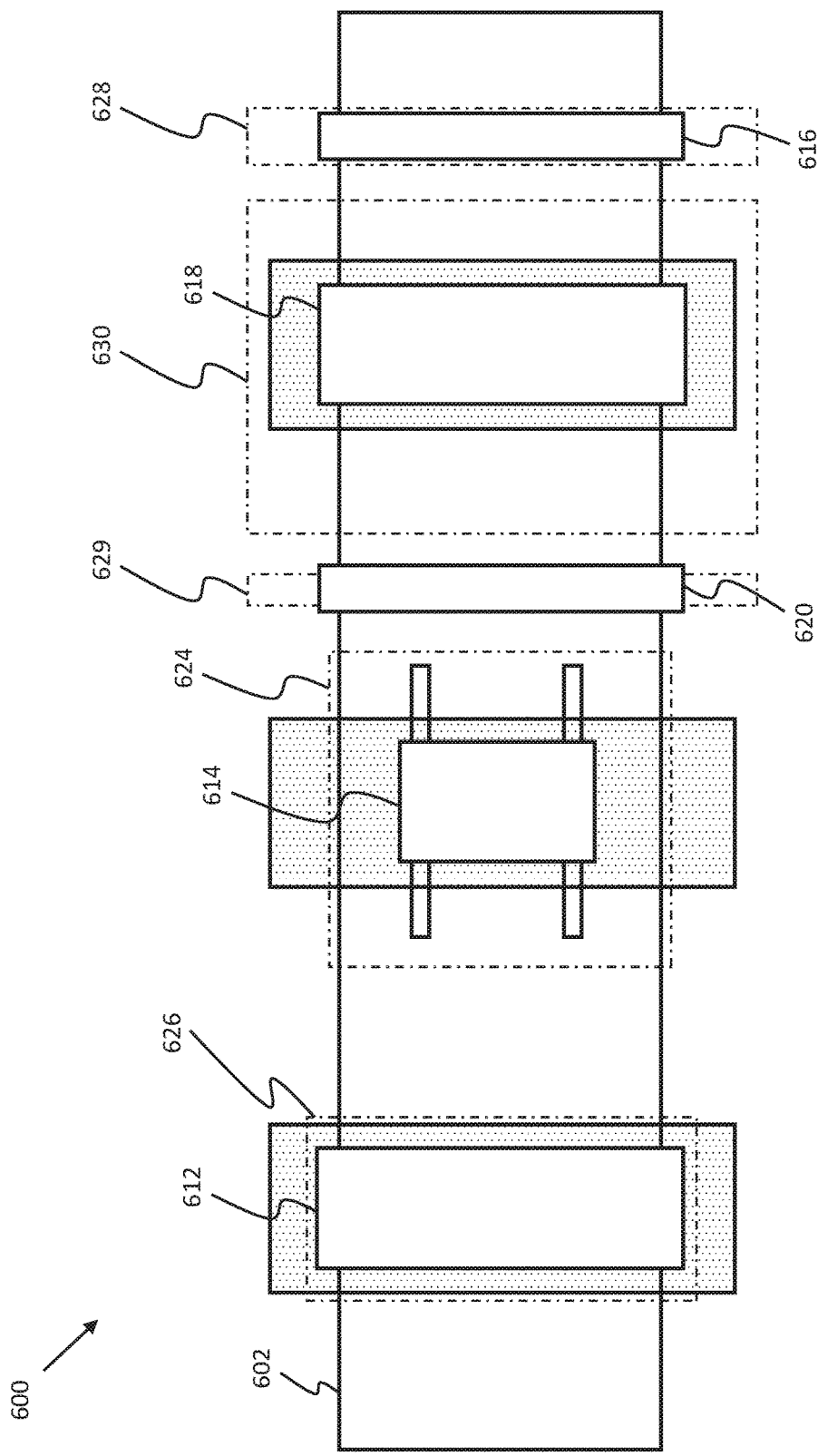

FIG. 6E illustrates doping steps in the fabrication of the HV switching device 600 where various regions are exposed to different doping profiles to form the necessary junctions to operate the different FETs. It should be understood that the different doped regions illustrated here may be doped in any order, with a masking layer deposited and pattered to expose each region to be doped. After the masking layer is removed, the process can be repeated to dope each successive region.

A first doped region 624 is formed by masking all areas except for the area within first doped region 624, and implanting dopants within the exposed second doping region 626. According to an embodiment, first doped region 624 represents a deeper n-type region beneath the switching FET. In some embodiments, first doped region 624 extends out beyond the gate structure 614 to provide a higher breakdown voltage.

According to some embodiments, first doped region 624 is formed using more than one doping step. For example, a plurality of doping steps with each step including a different implantation energy and/or different dopant can be used. In one particular example, an n-type region can be formed with four doping steps that include using both arsenic and phosphorus to create a deep n-type junction with a sloped profile. The doping process may also include a p-type dopant to dope gate structure 614. The p-type doping process may use a plasma doping technique. According to some embodiments, first doped region 624 has a junction depth within semiconductor layer 602 anywhere between 1000 nm and about 1500 nm. With reference to FIG. 3, first doped region 624 may represent first doped region 314. According to some embodiments, p-type dopants may be used to form first doped region 624 within semiconductor layer 602 in situations where an n-channel switching device is used.

A second doped region 626 is formed by masking all areas except for the area within second doped region 626, and implanting dopants within the exposed second doped region 626. In some embodiments, second doped region 626 is formed before the n-type doping step described in FIG. 6D. According to an embodiment, a n-type dopant is used and penetrates through gate structure 612 to the underlying semiconductor layer 602. The use of n-type dopant along with the surrounding n-type dopant from the doping step of FIG. 6D provides a negative threshold voltage for a depletion-mode FET. In one example, an implantation energy around 70 keV may be used to implant phosphorus. According to some embodiments, the n-type dopant is implanted to form a junction depth within semiconductor layer 602 anywhere between 200 nm and about 400 nm. With reference to FIG. 3, second doped region 626 may represent second doped region 316. In some embodiments, a p-type dopant is provided within second doped region 626 in situations where an n-channel switching device is used.

A third doped region 628 and a fourth doped region 629 are formed by masking all areas except for the areas within third doped region 628 and fourth doped region 629, and implanting dopants within the exposed third doped region 628 and fourth doped region 629. According to an embodiment, a p-type dopant is used and penetrates through both gate structures 616 and 620 to the underlying semiconductor layer 602. According to some embodiments, one or both of third doped region 628 and fourth doped region 629 is formed using more than one doping step. For example, a plurality of doping steps with each step including a different implantation energy and/or different dopant can be used. In one particular example, a p-type region can be formed with three doping steps that include using boron at different implantation energies for each step. A first boron implantation can be performed at less than 50 keV, a second boron implantation can be performed at around 100 keV and a third boron implantation can be performed at around 200 keV, in accordance with an embodiment. With reference to FIG. 4, fourth doped region 629 may represent fourth doped region 408. Third doped region 628 and fourth doped region 629 may be formed during the same doping operation or at different times with different doping operations.

A fifth doped region 630 is formed by masking all areas except for the area within fifth doped region 630, and implanting dopants within the exposed fifth doped region 630. According to an embodiment, a p-type dopant is used and penetrates through gate structure 618 to the underlying semiconductor layer 602. According to some embodiments, fifth doped region 630 is formed using more than one doping step. For example, a plurality of doping steps with each step including a different implantation energy and/or different dopant can be used. In one particular example, a p-type region can be formed with two doping steps that include using boron at different implantation energies for each step. A first boron implantation can be performed at less than 50 keV and a second boron implantation can be performed at around 400 keV, in accordance with an embodiment.

Figure 6F:
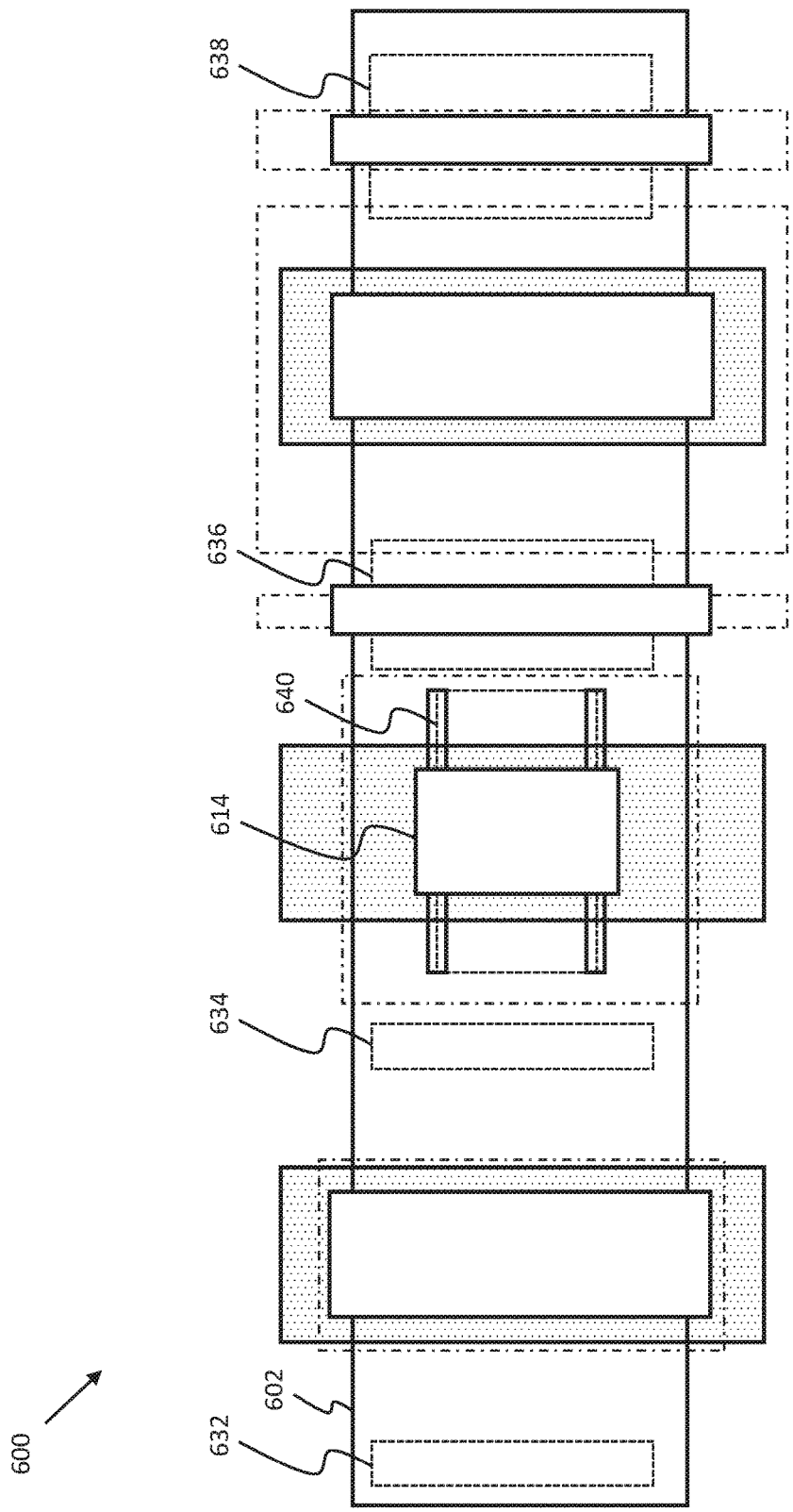

FIG. 6F illustrates doping steps in the fabrication of the HV switching device 600 where various regions are exposed to different doping profiles to form the source and drain regions for the various FET devices. It should be understood that the different doped regions illustrated here may be doped in any order, with a masking layer deposited and patterned to expose each region to be doped. After the masking layer is removed, the process can be repeated to dope each successive region.

Each of doped regions 632, 634, 636, and 638 can be formed at the same time to yield n+ doped regions to act as source/drain regions for n-channel FET devices, according to some embodiments. The dopant energy may be low enough to not penetrate the gate structures, such that doped regions 636 and 638 are aligned along the edges of the respective gate structures (e.g., edges of gate spacers if gate spacers are used on the sidewalls of the gates) within semiconductor layer 602. In one example, an implantation energy around 20 keV may be used to implant phosphorus. With reference to FIGS. 3 and 4, doped regions 632 and 634 may respectively represent doped regions 324 and 326, and doped region 636 may represent each of doped regions 410 and 412.

Doped region 640 can be used to form p+ source/drain regions for the switching FET, according to some embodiments. The dopant energy may be low enough to not penetrate gate structure 614, such that doped region 640 is aligned along the edges of gate structure 614 (e.g., edges of gate spacers if gate spacers are used on the sidewalls of gate structure 614) within semiconductor layer 602. In one example, a plasma doping technique is used with an activation energy around 8000 V to implant boron. With reference to FIG. 3, doped region 640 may represent each of doped regions 328 and 330.

Figure 6G:
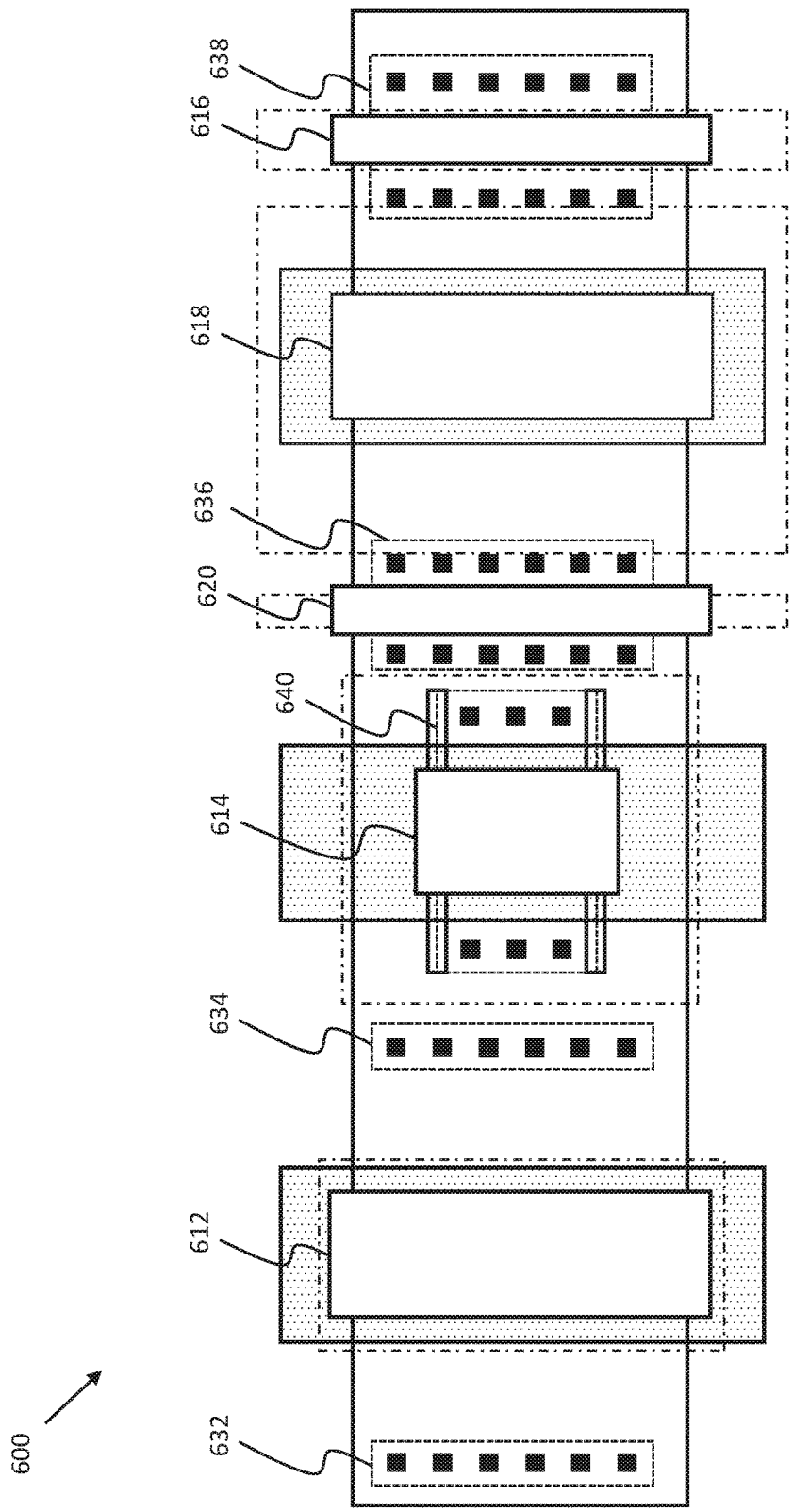

FIG. 6G illustrates the formation of numerous contacts down to the doped source and drain regions 632, 634, 636, 638, and 640, according to an embodiment. Contacts would also be formed to each of the gate structures, though these are not illustrated for clarity. The contacts may be formed from tungsten or any other conductive material. The contacts can be formed using any conventional fabrication techniques used to form metal interconnect structures. In some embodiments, the contacts each have a width of about 100 nm and a thickness between about 100 nm and 500 nm.

As observed from FIG. 6G, the source/drain regions and their associated contacts for the HV devices are spaced further from the gate structures than for the LV devices. For example, the contacts of doped regions 632 and 634 are spaced relatively far from gate structure 612, the contacts of doped region 640 are spaced relatively far from gate structure 614, and the contacts of doped regions 636 and 638 are spaced relatively far from gate structure 618 since each of these devices are HV devices. On the other hand, the contacts of doped region 638 are spaced relatively close to gate structure 616 and the contacts of doped region 636 are spaced relatively close to gate structure 620 since these devices are LV devices.

Figure 6H:
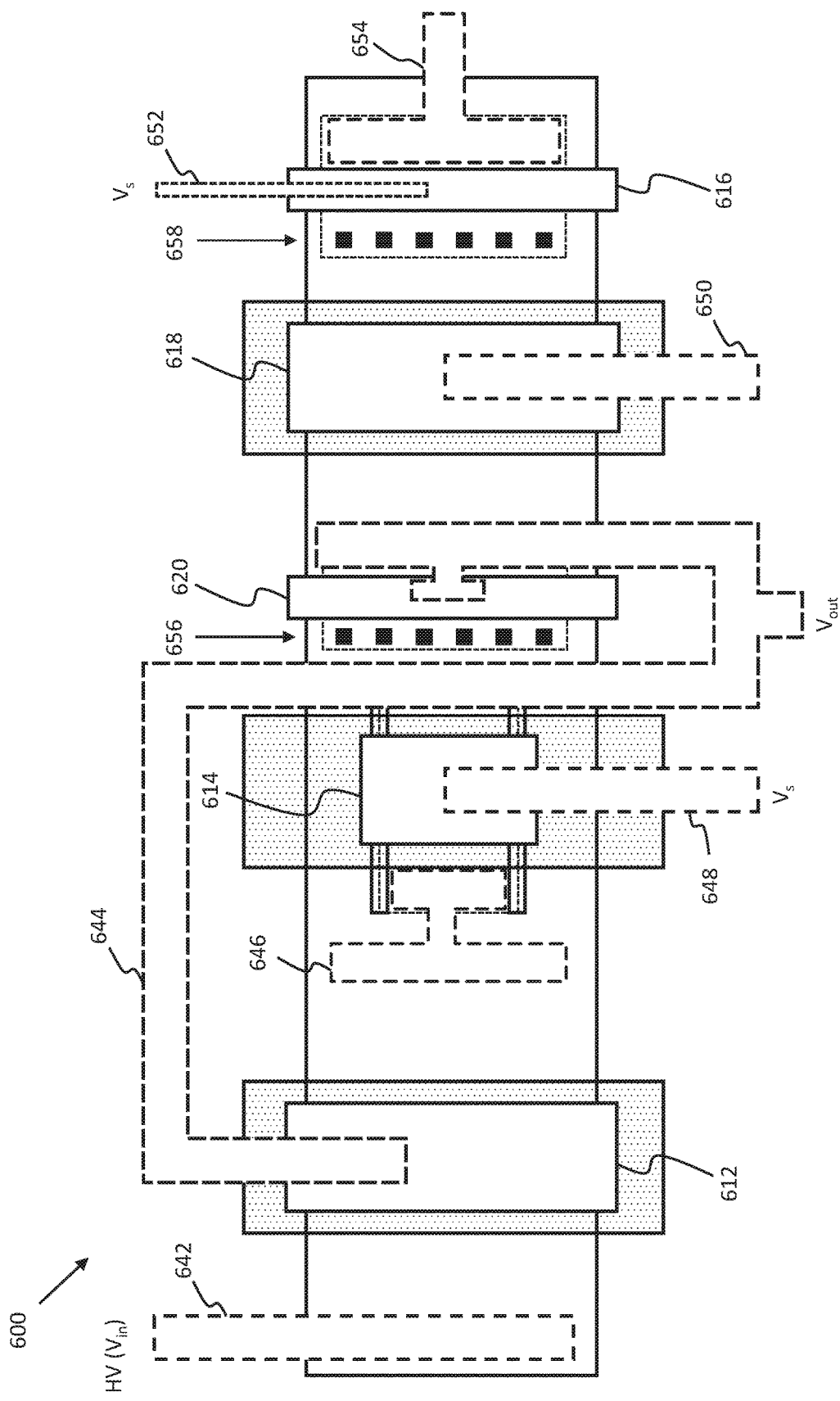

FIG. 6H illustrates the formation of metal interconnect structures (e.g., metal traces) that connect various portions of the underlying structures, in accordance with an embodiment. The metal traces may be copper or gold and can be formed using any conventional fabrication techniques used to form metal interconnect structures. A first metal trace 642 may be formed to make connection to doped region 632 and deliver the $V_{in}$ signal. A second metal trace 644 may be formed to connect the gate structure 612 to the drain side of doped region 640, the source side of doped region 636 and gate structure 616. The second metal trace also carries the $V_{out}$ signal. In some embodiments, the portion of second metal trace 644 that contacts gate structure 620 is on a different metal level than the other portions of second metal trace 644. A third metal trace 646 may be used to connect doped region 636 with the source side of doped region 640. A fourth metal trace 648 may be used to make connection with gate structure 614 and deliver the switching signal $V_s$. A fifth metal structure 650 may be used to make connection to gate structure 618 and can deliver a bias voltage to bias the discharge FET in an on state. A sixth metal structure 652 may be used to make connection to gate structure 616 and also deliver switching signal $V_s$ to gate structure 616 in order to pull the output voltage to ground when the HV switch is off. A seventh metal structure 654 may be used to contact the source side of doped region 638 to couple with other circuitry or a ground plane.

In some embodiments, fewer contacts than the ones illustrated in FIG. 6G are needed. For example, the row of contacts 656 and the row of contacts 658 may be omitted as these contacts are not connected to any metal traces.

Example Electronic Device

Figure 7:
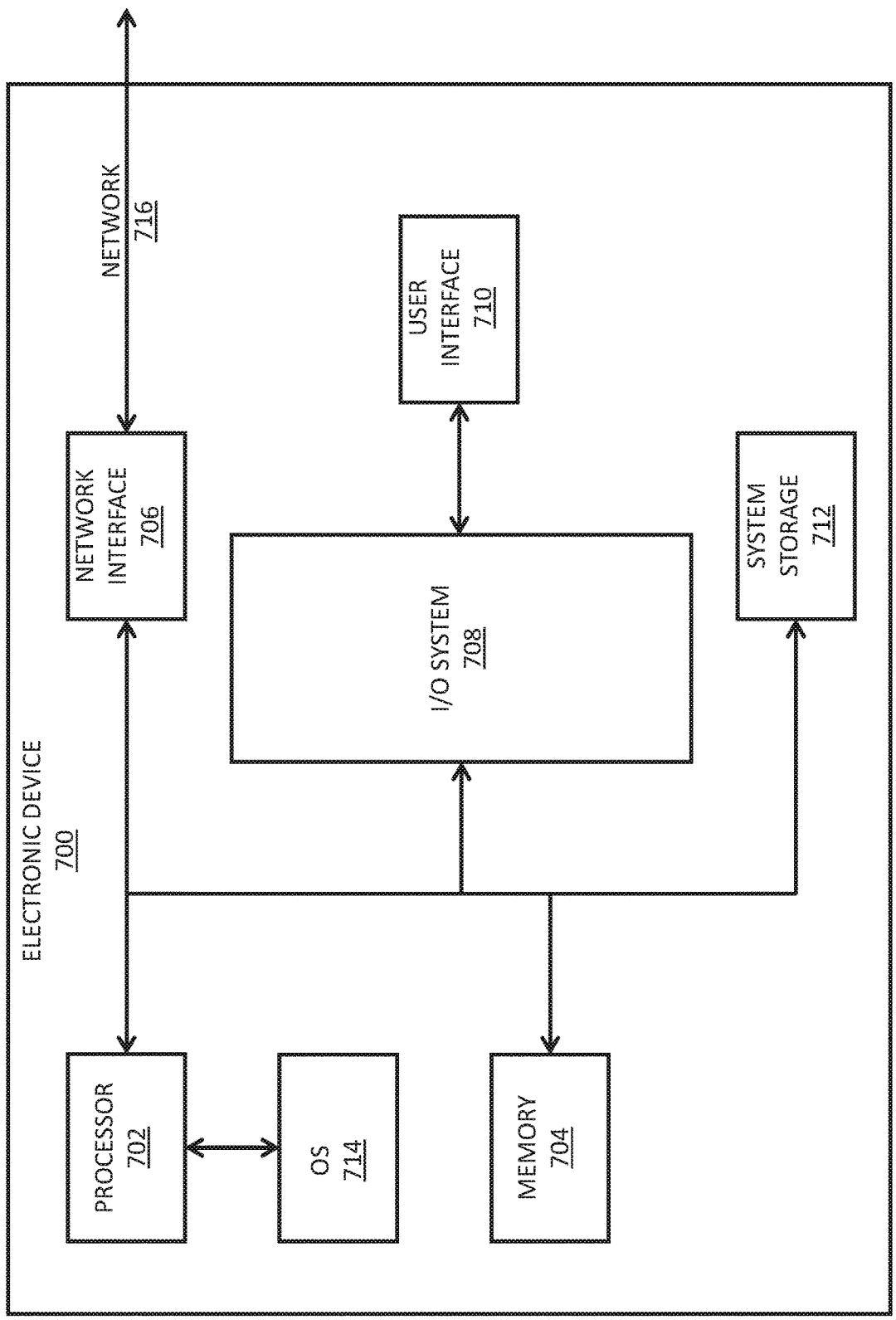
FIG. 7 illustrates an example electronic device that can include one or more of the embodiments of the present disclosure.

FIG. 7 illustrates an example electronic device 700 that may include one or more HV switching devices such as the embodiments disclosed herein. In some embodiments, electronic device 700 may host, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, imaging device, wearable device, embedded system, and so forth. Any combination of different devices may be used in certain embodiments.

In some embodiments, electronic device 700 may comprise any combination of a processor 702, a memory 704, a network interface 706, an input/output (I/O) system 708, a user interface 710, and a storage system 712. As can be further seen, a bus and/or interconnect is also provided to allow for communication between the various components listed above and/or other components not shown. Electronic device 700 can be coupled to a network 716 through network interface 706 to allow for communications with other computing devices, platforms, or resources. Other componentry and functionality not reflected in the block diagram of FIG. 7 will be apparent in light of this disclosure, and it will be appreciated that other embodiments are not limited to any particular hardware configuration.

Processor 702 can be any suitable processor and may include one or more coprocessors or controllers to assist in control and processing operations associated with electronic device 700. In some embodiments, processor 702 may be implemented as any number of processor cores. The processor (or processor cores) may be any type of processor, such as, for example, a micro-processor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core.

Memory 704 can be implemented using any suitable type of digital storage including, for example, flash memory and/or random-access memory (RAM). In some embodiments, memory 704 may include various layers of memory hierarchy and/or memory caches. Memory 704 may be implemented as a volatile memory device such as, but not limited to, a RAM, dynamic RAM (DRAM), or static RAM (SRAM) device. Storage system 712 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage system 712 may comprise technology to increase the storage performance enhanced protection for valuable digital media when multiple hard drives are included. According to some embodiments, one or both of memory 704 and storage system 712 implements HV switching devices, such as any of the HV switching device embodiments discussed herein, to provide high-voltage erase signals to the memory cells.

Processor 702 may be configured to execute an Operating System (OS) 714 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS).

Network interface 706 can be any appropriate network chip or chipset which allows for wired and/or wireless connection between other components of electronic device 700 and/or network 716, thereby enabling electronic device 700 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 708 may be configured to interface between various I/O devices and other components of electronic device 700. I/O devices may include, but not be limited to, a user interface 710. User interface 710 may include devices (not shown) such as a display element, touchpad, keyboard, mouse, and speaker, etc. I/O system 708 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 702 or any chipset of electronic device 700.

It will be appreciated that in some embodiments, the various components of the electronic device 700 may be combined or integrated in a system-on-a-chip (SoC) architecture. In some embodiments, the components may be hardware components, firmware components, software components or any suitable combination of hardware, firmware or software.

In various embodiments, electronic device 700 may be implemented as a wireless system, a wired system, or a combination of both. When implemented as a wireless system, electronic device 700 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, electronic device 700 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

Further Example Embodiments

The following examples pertain to further embodiments, from which numerous permutations and configurations will be apparent.

Example 1 is a semiconductor device that includes a layer comprising semiconductor material, a first transistor device, and a second transistor device. The layer has a first doped region, a second doped region, and a third doped region. Each of the regions has a first dopant type. The first doped region extends further into a thickness of the layer than the second or third doped regions, and the third doped region provides a conductive pathway between the first doped region and the second doped region. The first transistor device has a first gate structure over the first doped region, a first source region, and a first drain region. The first source region and the first drain region are doped with a second dopant type that is opposite to the first dopant type and at a higher concentration than the first dopant type of any of the first, second, or third doped regions. The second transistor device has a second gate structure over the second doped region, a second source region, and a second drain region. The second source region and the second drain region are doped with the first dopant type at a higher concentration than the first dopant type of any of the first, second, or third doped regions.

Example 2 includes the subject matter of Example 1, wherein the layer further comprises a fourth doped region doped with the first dopant type at a higher concentration than the first dopant type of the first, second, or third doped regions, the fourth doped region located adjacent to the first drain region.

Example 3 includes the subject matter of Example 2, further comprising one or more metal interconnect structures that electrically connect the second source region, the first source region, and the fourth doped region.

Example 4 includes the subject matter of any one of Examples 1-3, further comprising one or more metal interconnect structures that electrically connect the first drain region with the second gate structure.

Example 5 includes the subject matter of any one of Examples 1-4, further comprising an isolation structure that extends through at least a portion of the layer and at a depth at least as deep as a total thickness of the third doped region.

Example 6 includes the subject matter of any one of Examples 1-5, further comprising a fourth doped region in the layer having the second dopant type, and a third transistor device having a third gate structure on the fourth doped region, a third source region, and a third drain region.

Example 7 includes the subject matter of Example 6, wherein the third gate structure is electrically connected to the first drain region of the first transistor device and the second gate structure of the second transistor device.

Example 8 includes the subject matter of Example 6 or 7, wherein the third source region is electrically connected to the third gate structure.

Example 9 includes the subject matter of any one of Examples 6-8, wherein the first gate structure has a first gate dielectric, the second gate structure has a second gate dielectric, and the third gate structure has a third gate dielectric with a lower thickness than the first gate dielectric or the second gate dielectric.

Example 10 includes the subject matter of any one of Examples 6-9, wherein the third drain region is electrically connected to the second source region and the first source region.

Example 11 includes the subject matter of any one of Examples 1-10, wherein the first doped region extends into the layer to a depth between about 1000 nm and about 1500 nm.

Example 12 includes the subject matter of any one of Examples 1-11, wherein the second doped region extends into the layer to a depth between about 200 nm and about 400 nm.

Example 13 includes the subject matter of any one of Examples 1-12, wherein the third doped region extends into the layer to a depth between about 300 nm and about 600 nm.

Example 14 includes the subject matter of any one of Examples 1-13, wherein the first doped region, the second doped region, and the third doped region are each n-type regions.

Example 15 is a semiconductor device that includes a layer comprising semiconductor material, a first transistor device, a second transistor device, and a third transistor device. The layer has a first doped region, a second doped region, and a third doped region. Each of the doped regions has a first dopant type and the third doped region provides a conductive pathway between the first doped region and the second doped region. The first transistor device has a first gate structure over the first doped region, a first source region, and a first drain region. The first source region and the first drain region are doped with a second dopant type that is opposite to the first dopant type and at a higher concentration than the first dopant type of any of the first, second, or third doped regions. The second transistor device has a second gate structure, a second source region, and a second drain region. The second source region and the second drain region are doped with the first dopant type at a higher concentration than the first dopant type of any of the first, second, or third doped regions. The third transistor device has a third gate structure adjacent to the second gate structure such that the third transistor device shares the second source region and the second drain region of the second transistor device. The second doped region is beneath one or both of the second transistor device and the third transistor device.

Example 16 includes the subject matter of Example 15, further comprising one or more metal interconnect structures that electrically connect the first drain region with the second gate structure.

Example 17 includes the subject matter of Example 15 or 16, wherein the first doped region extends further into a thickness of the layer than the second doped region.

Example 18 includes the subject matter of any one of Examples 15-17, wherein the layer further comprises a fourth doped region doped with the first dopant type at a higher concentration than the first dopant type of the first, second, or third doped regions, the fourth doped region located adjacent to the first drain region.

Example 19 includes the subject matter of Example 18, further comprising one or more metal interconnect structures that electrically connect the second source region, the first source region, and the fourth doped region.

Example 20 includes the subject matter of any one of Examples 15-19, further comprising a shallow trench isolation (STI) structure that extends through at least a portion of the layer and at a depth at least as deep as a total thickness of the third doped region.

Example 21 includes the subject matter of any one of Examples 15-20, further comprising a fourth doped region in the layer having the second dopant type, and a fourth transistor device having a fourth gate structure over the fourth doped region, a fourth source region adjacent to the fourth gate structure, and a fourth drain region adjacent to the fourth gate structure.

Example 22 includes the subject matter of Example 21, wherein the fourth gate structure is electrically connected to the first drain region of the first transistor device and the second gate structure of the second transistor device.

Example 23 includes the subject matter of Example 21 or 22, wherein the fourth source region is electrically connected to the fourth gate structure.

Example 24 includes the subject matter of any one of Examples 21-23, wherein the first gate structure has a first gate dielectric, the second gate structure has a second gate dielectric, the third gate structure has a third gate dielectric, and the fourth gate structure has a fourth gate dielectric with a lower thickness than any of the first gate dielectric, the second gate dielectric, or the third gate dielectric.

Example 25 includes the subject matter of any one of Examples 21-24, wherein the fourth drain region is electrically connected to the second source region and the first source region.

Example 26 includes the subject matter of any one of Examples 15-25, wherein the first doped region extends into the layer to a depth between about 1000 nm and about 1500 nm.

Example 27 includes the subject matter of any one of Examples 15-26, wherein the second doped region extends into the layer to a depth between about 200 nm and about 400 nm.

Example 28 includes the subject matter of any one of Examples 15-27, wherein the third doped region extends into the layer to a depth between about 300 nm and about 600 nm.

Example 29 includes the subject matter of any one of Examples 15-28, wherein the first doped region, the second doped region, and the third doped region are each n-type regions.

Example 30 is a memory device that includes a memory array having a plurality of memory cells and at least one high voltage switching device. The high voltage switching device is coupled to at least a portion of the plurality of memory cells and includes a layer comprising semiconductor material, a first transistor device, and a second transistor device. The layer has a first doped region, a second doped region, and a third doped region. Each of the regions has a first dopant type. The first doped region extends further into a thickness of the layer than the second or third doped regions, and the third doped region provides a conductive pathway between the first doped region and the second doped region. The first transistor device has a first gate structure over the first doped region, a first source region, and a first drain region. The first source region and the first drain region are doped with a second dopant type that is opposite to the first dopant type and at a higher concentration than the first dopant type of any of the first, second, or third doped regions. The second transistor device has a second gate structure over the second doped region, a second source region, and a second drain region. The second source region and the second drain region are doped with the first dopant type at a higher concentration than the first dopant type of any of the first, second, or third doped regions.

Example 31 includes the subject matter of Example 30, wherein the layer further comprises a fourth doped region doped with the first dopant type at a higher concentration than the first dopant type of any of the first, second, or third doped regions, the fourth doped region located adjacent to the first drain region.

Example 32 includes the subject matter of Example 31, further comprising one or more metal interconnect structures that electrically connect the second source region, the first source region, and the fourth doped region.

Example 33 includes the subject matter of any one of Examples 30-32, further comprising one or more metal interconnect structures that electrically connect the first drain region with the second gate structure.

Example 34 includes the subject matter of any one of Examples 30-33, further comprising a shallow trench isolation (STI) structure that extends through at least a portion of the layer and at a depth at least as deep as a total thickness of the third doped region.

Example 35 includes the subject matter of any one of Examples 30-34, further comprising a fourth doped region in the layer having the second dopant type, and a third transistor device having a third gate structure over the fourth doped region, a third source region adjacent to the third gate structure, and a third drain region adjacent to the third gate structure.

Example 36 includes the subject matter of Example 35, wherein the third gate structure is electrically connected to the first drain region of the first transistor device and the second gate structure of the second transistor device.

Example 37 includes the subject matter of Example 35 or 36, wherein the third source region is electrically connected to the third gate structure.

Example 38 includes the subject matter of any one of Examples 35-37, wherein the first gate structure has a first gate dielectric, the second gate structure has a second gate dielectric, and the third gate structure has a third gate dielectric with a lower thickness than the first gate dielectric or the second gate dielectric.

Example 39 includes the subject matter of any one of Examples 35-38, wherein the third drain region is electrically connected to the second source region and the first source region.

Example 40 includes the subject matter of any one of Examples 30-39, wherein the first doped region extends into the layer to a depth between about 1000 nm and about 1500 nm.

Example 41 includes the subject matter of any one of Examples 30-40, wherein the second doped region extends into the layer to a depth between about 200 nm and about 400 nm.

Example 42 includes the subject matter of any one of Examples 30-41, wherein the third doped region extends into the layer to a depth between about 300 nm and about 600 nm.

Example 43 includes the subject matter of any one of Examples 30-42, wherein the first doped region, the second doped region, and the third doped region are each n-type regions.

Example 44 is a memory device, comprising: a memory array comprising a plurality of memory cells; and at least one high-voltage switching device coupled to at least a portion of the plurality of memory cells. The high-voltage switching device includes: a layer comprising semiconductor material and having a first doped region, a second doped region, and a third doped region, each region having a first dopant type, the first doped region extending further into a thickness of the layer than the second doped region, and the third doped region providing a conductive pathway between the first doped region and the second doped region; a first transistor device having a first gate structure over the first doped region, a first source region adjacent to the first gate structure, and a first drain region adjacent to the first gate structure, wherein the first source region and the first drain region are doped with a second dopant type that is opposite to the first dopant type and at a higher concentration than the first dopant type of the first or second doped regions; and a second transistor device having a second gate structure over the second doped region, a second source region adjacent to the second gate structure, and a second drain region adjacent to the second gate structure, wherein the second source region and the second drain region are doped with the first dopant type at a higher concentration than the first dopant type of the first or second doped regions.

Example 45 includes the subject matter of Example 44, wherein the first doped region extends into the layer to a first depth (e.g., a depth between about 1000 nm and about 1500 nm), the second doped region extends into the layer to a second depth (e.g., a depth between about 200 nm and about 400 nm), and the third doped region extends into the layer to a third depth (e.g., a depth between about 300 nm and about 600 nm).

Numerous specific details have been set forth herein to provide a thorough understanding of the embodiments. It will be understood in light of this disclosure, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

What is claimed is:

1. A semiconductor device, comprising:
    a layer comprising semiconductor material and having a first doped region, a second doped region, and a third doped region, each region having a first dopant type, the first doped region extending further into a thickness of the layer than the second or third doped regions, wherein the third doped region provides a conductive pathway between the first doped region and the second doped region;
    a first transistor device having a first gate structure on the first doped region, a first source region, and a first drain region, wherein the first source region and the first drain region are doped with a second dopant type that is opposite to the first dopant type and at a higher concentration than the first dopant type of any of the first, second, or third doped regions; and
    a second transistor device having a second gate structure on the second doped region, a second source region, and a second drain region, wherein the second source region and the second drain region are doped with the first dopant type at a higher concentration than the first dopant type of any of the first, second, or third doped regions.

2. The semiconductor device of claim 1, wherein the layer further comprises a fourth doped region doped with the first dopant type at a higher concentration than the first dopant type of the first, second, or third doped regions, the fourth doped region located adjacent to the first drain region.

3. The semiconductor device of claim 2, further comprising one or more metal interconnect structures that electrically connect the second source region, the first source region, and the fourth doped region.

4. The semiconductor device of claim 1, further comprising one or more metal interconnect structures that electrically connect the first drain region with the second gate structure.

5. The semiconductor device of claim 1, further comprising an isolation structure that extends through at least a portion of the layer and at a depth at least as deep as a total thickness of the third doped region.

6. The semiconductor device of claim 1, further comprising a fourth doped region in the layer having the second dopant type, and a third transistor device having a third gate structure on the fourth doped region, a third source region, and a third drain region.

7. The semiconductor device of claim 6, wherein the third gate structure is electrically connected to the first drain region of the first transistor device and the second gate structure of the second transistor device.

8. The semiconductor device of claim 7, wherein the third source region is electrically connected to the third gate structure.

9. The semiconductor device of claim 6, wherein the first gate structure has a first gate dielectric, the second gate structure has a second gate dielectric, and the third gate structure has a third gate dielectric with a lower thickness than the first gate dielectric or the second gate dielectric.

10. The semiconductor device of claim 6, wherein the third drain region is electrically connected to the second source region and the first source region.

11. The semiconductor device of claim 1, wherein the first doped region extends into the layer to a depth between about 1000 nanometers (nm) and about 1500 nm, the second doped region extends into the layer to a depth between about 200 nm and about 400 nm, and the third doped region extends into the layer to a depth between about 300 nm and about 600 nm.

12. The semiconductor device of claim 1, wherein the first doped region, the second doped region, and the third doped region are each n-type regions.

13. A semiconductor device, comprising:
a layer comprising semiconductor material and having a first doped region, a second doped region, and a third doped region, each region having a first dopant type, wherein the third doped region provides a conductive pathway between the first doped region and the second doped region;
a first transistor device having a first gate structure over the first doped region, a first source region adjacent to the first gate structure, and a first drain region adjacent to the first gate structure, wherein the first source region and the first drain region are doped with a second dopant type that is opposite to the first dopant type and at a higher concentration than the first dopant type of any of the first, second, or third doped regions;
a second transistor device having a second gate structure, a second source region adjacent to the second gate structure, and a second drain region adjacent to the second gate structure, wherein the second source region and the second drain region are doped with the first dopant type at a higher concentration than the first dopant type of any of the first, second, or third doped regions; and
a third transistor device having a third gate structure adjacent to the second gate structure such that the third transistor device shares the second source region and the second drain region of the second transistor device; and
wherein the second doped region is beneath one or both of the second transistor device and the third transistor device.

14. The semiconductor device of claim 13, wherein the first doped region extends further into a thickness of the layer than the second doped region.

15. The semiconductor device of claim 13, further comprising a shallow trench isolation (STI) structure that extends through at least a portion of the layer and at a depth at least as deep as a total thickness of the third doped region.

16. The semiconductor device of claim 13, further comprising a fourth doped region in the layer having the second dopant type, and a fourth transistor device having a fourth gate structure over the fourth doped region, a fourth source region adjacent to the fourth gate structure, and a fourth drain region adjacent to the fourth gate structure.

17. The semiconductor device of claim 16, wherein the fourth gate structure is electrically connected to the first drain region of the first transistor device and the second gate structure of the second transistor device.

18. The semiconductor device of claim 16, wherein the first gate structure has a first gate dielectric, the second gate structure has a second gate dielectric, the third gate structure has a third gate dielectric, and the fourth gate structure has a fourth gate dielectric with a lower thickness than any of the first gate dielectric, the second gate dielectric, or the third gate dielectric.

19. A memory device, comprising:
a memory array comprising a plurality of memory cells; and
at least one high-voltage switching device coupled to at least a portion of the plurality of memory cells, the high-voltage switching device comprising
a layer comprising semiconductor material and having a first doped region, a second doped region, and a third doped region, each region having a first dopant type, the first doped region extending further into a thickness of the layer than the second doped region, and the third doped region providing a conductive pathway between the first doped region and the second doped region;
a first transistor device having a first gate structure over the first doped region, a first source region adjacent to the first gate structure, and a first drain region adjacent to the first gate structure, wherein the first source region and the first drain region are doped with a second dopant type that is opposite to the first dopant type and at a higher concentration than the first dopant type of the first or second doped regions; and
a second transistor device having a second gate structure over the second doped region, a second source region adjacent to the second gate structure, and a second drain region adjacent to the second gate structure, wherein the second source region and the second drain region are doped with the first dopant type at a higher concentration than the first dopant type of the first or second doped regions.

20. The memory device of claim 19, wherein the first doped region extends into the layer to a depth between about 1000 nm and about 1500 nm, the second doped region extends into the layer to a depth between about 200 nm and about 400 nm, and the third doped region extends into the layer to a depth between about 300 nm and about 600 nm.

* * * * *